US011396616B2

(12) United States Patent
Kodama et al.

(10) Patent No.: US 11,396,616 B2
(45) Date of Patent: Jul. 26, 2022

(54) LIQUID CURABLE SILICONE ADHESIVE COMPOSITION, CURED PRODUCT THEREOF, AND USE THEREOF

(71) Applicant: DOW TORAY CO., LTD., Tokyo (JP)

(72) Inventors: Harumi Kodama, Ichihara (JP); Toyohiko Fujisawa, Ichihara (JP); Yoshito Ushio, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 358 days.

(21) Appl. No.: 16/500,335

(22) PCT Filed: Mar. 19, 2018

(86) PCT No.: PCT/JP2018/010860

§ 371 (c)(1),
(2) Date: Oct. 2, 2019

(87) PCT Pub. No.: WO2018/186165

PCT Pub. Date: Oct. 11, 2018

(65) Prior Publication Data

US 2020/0123417 A1 Apr. 23, 2020

(30) Foreign Application Priority Data

Apr. 6, 2017 (JP) ............................. JP2017-075788

(51) Int. Cl.

| | |
|---|---|
| ***C09J 7/35*** | (2018.01) |
| ***C09J 7/32*** | (2018.01) |
| ***B32B 7/06*** | (2019.01) |
| ***B32B 7/12*** | (2006.01) |
| ***B32B 37/12*** | (2006.01) |
| ***B32B 37/18*** | (2006.01) |
| ***C09J 5/06*** | (2006.01) |
| ***C09J 11/04*** | (2006.01) |
| ***C09J 11/06*** | (2006.01) |
| ***H01L 21/683*** | (2006.01) |

(52) U.S. Cl.

CPC *C09J 7/35* (2018.01); *B32B 7/06* (2013.01); *B32B 7/12* (2013.01); *B32B 37/1207* (2013.01); *B32B 37/18* (2013.01); *C09J 5/06* (2013.01); *C09J 7/32* (2018.01); *C09J 11/04* (2013.01); *C09J 11/06* (2013.01); *H01L 21/6836* (2013.01); *B32B 2305/72* (2013.01); *B32B 2457/00* (2013.01); *C09J 2203/326* (2013.01); *C09J 2483/00* (2013.01); *H01L 2221/68327* (2013.01)

(58) Field of Classification Search

CPC ......... C09J 7/35; C09J 5/06; C09J 7/32; C09J 11/04; C09J 11/06; C09J 2203/326; C09J 2483/00; C09J 183/04; C09J 7/00; B32B 7/06; B32B 7/12; B32B 37/1207; B32B 37/18; B32B 2305/72; B32B 2457/00; H01L 21/6836; H01L 2221/68327; H01L 21/52; C08G 77/18; C08G 77/20

See application file for complete search history.

(56) References Cited

U.S. PATENT DOCUMENTS

| | | | | |
|---|---|---|---|---|
| 4,740,480 | A | | 4/1988 | Ooka |
| 4,921,926 | A | | 5/1990 | Motegi et al. |
| 5,006,372 | A | | 4/1991 | Wolfer et al. |
| 5,006,378 | A | | 4/1991 | Wolfer et al. |
| 5,916,981 | A | | 6/1999 | Cifuentes et al. |
| 5,985,371 | A | * | 11/1999 | Fujioka ................ C09D 183/04 427/387 |
| 6,075,112 | A | | 6/2000 | Irie et al. |
| 6,235,862 | B1 | | 5/2001 | Isshiki et al. |
| 8,957,153 | B2 | | 2/2015 | Kodama et al. |
| 2004/0044132 | A1 | | 3/2004 | Kozakai et al. |

(Continued)

FOREIGN PATENT DOCUMENTS

| | | | |
|---|---|---|---|
| EP | 0157508 | A2 | 10/1985 |
| EP | 3450159 | A1 | 3/2019 |

(Continued)

OTHER PUBLICATIONS

English translation of International Search Report for PCT/JP2018/010860 dated Jun. 12, 2018, 2 pages.
Machine assisted English translation of JP2007191629A obtained from https://patents.google.com on Oct. 1, 2019, 12 pages.
Machine assisted English translation of JP2007231195A obtained from https://patents.google.com on Oct. 1, 2019, 8 pages.
Machine assisted English translation of JP2016124967A obtained from https://patents.google.com on Oct. 2, 2019, 22 pages.
Machine assisted English translation of WO2022024734A1 obtained from https://patents.google.com/patent on Mar. 23, 2022, 11 pages.
Machine assisted English translation of KR1020130143665A obtained from https://patents.google.com/patent on Aug. 24, 2021, 15 pages.
Machine assisted English translation of JP2014088483A obtained from https://patents.google.com/patent on Aug. 24, 2021, 12 pages.

(Continued)

*Primary Examiner* — Michael B Nelson
(74) *Attorney, Agent, or Firm* — Warner Norcross + Judd LLP

(57) ABSTRACT

A liquid curable silicone adhesive composition is provided. The composition is generally storage stable as a one-part composition at room temperature, can primarily cure at room temperature in the presence of moisture, and can secondarily cure at high temperatures, and can form a strong adhesive layer on a substrate or member. The liquid curable silicone adhesive composition comprises: a curable reactive organopolysiloxane which has a radical reactive group and a condensation reactive group in the same molecule or throughout the mixture; a condensation reaction catalyst; an organic peroxide; an adhesion imparting agent; and a cross-linkable silane. Herein, regarding the storage modulus ($G'_1$) of a cured product obtained by primarily curing the composition in the presence of moisture approximately at room temperature, along with the storage elastic modulus ($G'_2$) of a cured pro duct obtained by curing the composition, the increase rate (Δ) of the storage elastic modulus is at least 50%.

17 Claims, No Drawings

(56) References Cited

U.S. PATENT DOCUMENTS

| | | | |
|---|---|---|---|
| 2008/0262158 A1 | 10/2008 | Morita et al. | |
| 2009/0294796 A1 | 12/2009 | Morita et al. | |
| 2010/0148378 A1 | 6/2010 | Katayama et al. | |
| 2011/0071266 A1 | 3/2011 | Morita et al. | |
| 2011/0104470 A1 | 5/2011 | Anderson et al. | |
| 2011/0306746 A1 | 12/2011 | Tanaka et al. | |
| 2012/0058334 A1 | 3/2012 | Okamoto et al. | |
| 2012/0146088 A1 | 6/2012 | Tanikawa et al. | |
| 2012/0157624 A1 | 6/2012 | Saito | |
| 2013/0042973 A1 | 2/2013 | Sakamoto | |
| 2013/0183776 A1 | 7/2013 | Kashiwagi et al. | |
| 2014/0322522 A1 | 10/2014 | Yoo | |
| 2015/0028497 A1 | 1/2015 | Nakamura et al. | |
| 2015/0115311 A1 | 4/2015 | Yoshida et al. | |
| 2015/0284590 A1 | 10/2015 | Endo et al. | |
| 2016/0208138 A1 | 7/2016 | Nishijima et al. | |
| 2017/0121462 A1* | 5/2017 | Fujisawa | H01L 23/296 |
| 2018/0118939 A1 | 5/2018 | Zou | |
| 2018/0258332 A1 | 9/2018 | Song et al. | |
| 2019/0134946 A1 | 5/2019 | Choi et al. | |
| 2019/0169478 A1 | 6/2019 | Kong et al. | |
| 2020/0087514 A1 | 3/2020 | Fukui et al. | |
| 2020/0164613 A1 | 5/2020 | Fukui et al. | |

FOREIGN PATENT DOCUMENTS

| | | | |
|---|---|---|---|
| JP | S59204259 | A | 11/1984 |
| JP | S60115661 | A | 6/1985 |
| JP | S60196956 | A | 10/1985 |
| JP | S618945 | A | 1/1986 |
| JP | S6148945 | A | 3/1986 |
| JP | S6210145 | A | 1/1987 |
| JP | S62104145 | A | 5/1987 |
| JP | H01132664 | A | 5/1989 |
| JP | H0273879 | A | 3/1990 |
| JP | H10219197 | A | 8/1998 |
| JP | H10324860 | A | 12/1998 |
| JP | 2000086897 | A | 3/2000 |
| JP | 2002275450 | A | 9/2002 |
| JP | 2003213132 | A | 7/2003 |
| JP | 2004075918 | A | 3/2004 |
| JP | 2006335857 | A | 12/2006 |
| JP | 3865638 | B2 | 1/2007 |
| JP | 2007191629 | A | 8/2007 |
| JP | 2007231195 | A | 9/2007 |
| JP | 2008045091 | A | 2/2008 |
| JP | 4314454 | B2 | 8/2009 |
| JP | 2010159411 | A | 7/2010 |
| JP | 2011153249 | A | 8/2011 |
| JP | 2011526648 | A | 10/2011 |
| JP | 2012096361 | A | 5/2012 |
| JP | 2012219113 | A | 11/2012 |
| JP | 2014088483 | A | 5/2014 |
| JP | 5559345 | B2 | 7/2014 |
| JP | 5561986 | B2 | 7/2014 |
| JP | 5594232 | B2 | 9/2014 |
| JP | 2014534296 | A | 12/2014 |
| JP | 2015015324 | A | 1/2015 |
| JP | 5794229 | B2 | 10/2015 |
| JP | 2016124967 | A | 7/2016 |
| KR | 1020130143665 | A | 12/2013 |
| KR | 101579710 | B1 | 12/2015 |
| WO | 2007132910 | A1 | 11/2007 |
| WO | 2010131721 | A1 | 11/2010 |
| WO | 2011056832 | A1 | 5/2011 |
| WO | 2012140740 | A1 | 10/2012 |
| WO | 2015079904 | A1 | 6/2015 |
| WO | 2015155950 | A1 | 10/2015 |
| WO | 2022024734 | A1 | 2/2022 |

OTHER PUBLICATIONS

Machine assisted English translation of JP5561986B2 obtained from https://patents.google.com/patent on Aug. 24, 2021, 10 pages.

Machine assisted English translation of JP2002275450 obtained from https://patents.google.com/patent on Sep. 2, 2021, 8 pages.

Machine assisted English translation of JP2003213132 obtained from https://patents.google.com/patent on Sep. 2, 2021, 8 pages.

Machine assisted English translation of JP2006335857A obtained from https://patents.google.com/patent on Sep. 2, 2021, 10 pages.

Machine assisted English translation of JP2008045091A obtained from https://patents.google.com/patent on Sep. 2, 2021, 10 pages.

Machine assisted English translation of JP2010159411A obtained from https://patents.google.com/patent on Sep. 1, 2021, 12 pages.

Machine assisted English translation of JP2011153249A obtained from https://patents.google.com/patent on Sep. 2, 2021, 12 pages.

Machine assisted English translation of WO2012140740A1 obtained from https://patents.google.com/patent on Sep. 3, 2021, 11 pages.

Machine assisted English translation of JP2015015324 obtained from https://patents.google.com/patent on Sep. 2, 2021, 8 pages.

Machine assisted English translation of JP3865638A obtained from https://patents.google.com/patent on Sep. 1, 2021, 9 pages.

Machine assisted English translation of JPH10219197A obtained from https://patents.google.com/patent on Sep. 1, 2021, 11 pages.

Machine assisted English translation of JPS59204259A obtained from https://worldwide.espacenet.com/patent on Sep. 8, 2021, 4 pages.

Machine assisted English translation of JPS6148945A obtained from https://worldwide.espacenet.com/patent on Sep. 8, 2021, 4 pages.

Machine assisted English translation of JPS6210145A obtained from https://worldwide.espacenet.com/patent on Sep. 8, 2021, 4 pages.

Machine assisted English translation of JPS62104145A obtained from https://worldwide.espacenet.com/patent on Sep. 8, 2021, 3 pages.

Machine assisted English translation of WO2015079904A1 obtained from https://patents.google.com/patent on Sep. 3, 2021, 14 pages.

Machine assisted English translation of JPS60115661A obtained from https://worldwide.espacenet.com on Aug. 5, 2021, 5 pages.

Machine assisted English translation of JP4314454B2 obtained from https://patents.google.com/patent on Aug. 3, 2021, 9 pages.

Machine assisted English translation of JP2012096361A obtained from https://patents.google.com/patent on Aug. 3, 2021, 9 pages.

* cited by examiner

# LIQUID CURABLE SILICONE ADHESIVE COMPOSITION, CURED PRODUCT THEREOF, AND USE THEREOF

CROSS-REFERENCE TO RELATED APPLICATIONS

This application is the National Stage of International Appl. No. PCT/JP2018/010860 filed on 19 Mar. 2018, which claims priority to and all advantages of Japanese Appl. No. 2017-075788 filed on 6 Apr. 2017, the content of which is hereby incorporated by reference.

TECHNICAL FIELD

The present invention relates to a liquid curable silicone adhesive composition capable of stably storing a one-part composition at room temperature, in addition to being capable of primarily curing at low temperatures of 60° C. or lower in the presence of moisture, suitably at low temperatures of room temperature to approximately 50° C., and secondarily curing at high temperatures of 90° C. or higher, suitably 100° C. or higher, to form a strong adhesive layer on the contacted substrate or member. The present invention also relates to a high temperature curable primary cured product obtained by primarily curing the liquid curable silicone adhesive composition at low temperatures, a cured product obtained by curing the liquid curable silicone adhesive composition or the abovementioned primary cured product at high temperatures of 90° C. or higher, suitably 100° C. or higher, in addition to also relating to a method for adhering electronic equipment or a member for electronic equipment which is provided with the cured product of the liquid curable silicone adhesive composition.

BACKGROUND ART

In the field of adhesive films and semiconductor sealants, a curable composition has been proposed in which the curing reaction proceeds in multiple stages, assuming different curing reaction conditions. For example, Patent Document 1 discloses a thermosetting composition which exhibits adhesion required in a dicing process by curing in a first stage and strong adhesiveness by curing in a second stage, via a two-stage curing reaction, and is suitably used with dicing die bond adhesive sheets. Further, in Patent Document 2, the present applicants propose a curable silicone composition which is excellent in initial curability and maintains high physical strength even when exposed to high temperatures of 250° C. or higher. However, the curable composition assuming these conventionally known multi-stage curing utilizes a hydrosilylation reaction mainly in the primary curing reaction, making it difficult to design a one-pack liquid curable silicone product which can be stored for extended periods of time at room temperature, in addition to there being constraints on handling operations such as gelling of the entire system during transportation, etc.; moreover, if used as a multi-liquid type package such as a two-part type or even a one-part product, refrigerated or frozen storage is essential in order to suppress the hydrosilylation reaction, problematically substantially limiting the handleability and industrial applicability. In addition, when a hydrosilylation reaction is mainly used for the primary curing reaction, heating and curing at high temperatures is essential when the primary curing reaction progresses, necessitating a curing reaction at higher temperatures for the secondary curing reaction. Consequently, it is particularly difficult for the reaction to respond to room temperature or low temperature curing, limiting the specific locales at which it can be industrially applied.

On the other hand, Patent Document 3 proposes a curable organopolysiloxane composition which includes a condensation reaction catalyst and an ester based organic peroxide, in addition to being curable by ultraviolet irradiation. Unfortunately, in this Patent Document 3, no mention or suggestion has been made regarding the use of a high temperature reactive primary cured product obtained by primarily curing the composition at low temperatures in the presence of moisture, as well as regarding curing properties in multiple stages such as causing rapid changes in the storage modulus when a high temperature reactive primary cured product obtained by primarily curing the composition at low temperatures in the presence of moisture, such that a curable organopolysiloxane composition sufficiently having such potential properties has not been disclosed. That is, the abovementioned problems cannot be solved by the curable organopolysiloxane composition disclosed in Patent Document 3.

PRIOR ART DOCUMENTS

Patent Documents

[Patent Document 1] JP 2007-191629 A (JP 4628270 B)
[Patent Document 2] JP 2016-124967 A
[Patent Document 3] JP 01-132664 A

SUMMARY OF THE INVENTION

Problems to be Solved by the Invention

The present invention has been created to solve the abovementioned problem, with an object of providing a one-part liquid curable silicone product capable of storage at room temperature for extended periods of time, wherein the initial viscosity is sufficiently low, such that the liquid composition is capable of forming a non-fluid body (primary cured product) having excellent application properties and fluidity, and has no surface tack, if desired, at room temperature in the presence of moisture. A further object of the present invention is to provide a liquid curable silicone adhesive composition capable of forming a strong and good adhesive layer on various substrates by heating the liquid composition or the abovementioned primary cured product at high temperatures of 100° C. or higher. Further, another object of the present invention is to provide a high temperature curable primary cured product which is a non-fluid body having no surface tack and is capable of being transported as is, by curing the abovementioned liquid curable silicone adhesive composition in the presence of moisture at room temperature. Further, another object of the present invention is to provide a method for adhering a member for electronic equipment using the abovementioned liquid curable silicone adhesive composition or a primary cured product having high temperature curability, and to provide electronic equipment including the cured product thereof or a precursor thereof.

Means for Solving the Problems

As a result of extensive research in order to solve the abovementioned problems, the present inventors solved the problems described above via a liquid curable silicone adhesive composition, containing: a curable reactive organopolysiloxane which has a radical reactive group and a condensation reactive group in the same molecule or throughout the mixture; a condensation reaction catalyst; an organic peroxide; an adhesion imparting agent; and a crosslinkable silane, wherein, regarding the storage modulus ($G'_1$) of a cured product obtained by curing the composition in the presence of moisture within a temperature range of room temperature (25° C.) to 50° C., along with the storage elastic modulus ($G'_2$) of a cured product cured by heating and curing the composition at 100° C. or higher, the increase rate ($\Delta$) of $G'_2$ to $G'_1$ is at least 50%.

That is, the objects of the present invention are achieved by the following liquid curable silicone adhesive compositions.

[1] A liquid curable silicone adhesive composition, containing: 100 parts by mass of a curable reactive organopolysiloxane which is the following component (Y) or a mixture of two or more types selected from the group consisting of the following components (A), (B), and (Y), and has a radical reactive group along with a condensation reactive group in the same molecule or throughout the mixture:

(A) an organopolysiloxane having at least one radical reactive group per molecule;

(B) an organopolysiloxane having at least one condensation reactive group per molecule;

(Y) an organopolysiloxane having at least one radical reactive group and at least one condensation reactive group per molecule;

(C) 0.1 to 10 parts by mass of a condensation reaction catalyst;

(D) 0.1 to 10 parts by mass of an organic peroxide;

(E) 0.1 to 10 parts by mass of an adhesion imparting agent; and (F) 0.5 to 10 parts by mass of a crosslinkable silane having at least two condensation reactive groups per molecule (except for those corresponding to component (E));

wherein, regarding the storage modulus ($G'_1$) of a cured product obtained by curing the composition in the presence of moisture within a temperature range of room temperature (25° C.) to 50° C., along with the storage elastic modulus ($G'_2$) of a cured product cured by heating and curing the composition at 100° C. or higher, the increase rate ($\Delta$) of $G'_2$ to $G'_1$ is at least 50%.

[2] The liquid curable silicone adhesive composition according to [1], wherein the molecular structure of the curable organopolysiloxane is selected from linear, resinous, branched, or combinations thereof.

[3] The liquid curable silicone adhesive composition according to [1] or [2], wherein the radical reactive group in the curable organopolysiloxane is an alkenyl group, an acryl-containing organic group, or a methacryl-containing organic group, and wherein at least part of the condensation reactive group is an alkoxysilyl-containing group or a silanol group.

[4] The liquid curable silicone adhesive composition according to any one of [1] to [3], wherein the curing reactive organopolysiloxane is selected from the following component (Y1) and mixtures of two or more types selected from the group consisting of the following components (A1), (B1), and (Y1).

(A1): a methylpolysiloxane having at least one alkenyl group per molecule;

(B1): a methylpolysiloxane having at least one alkoxysilyl-containing group per molecule; and (Y1): a methylpolysiloxane having at least one alkenyl group and at least one alkoxysilyl-containing group per molecule.

[5] The liquid curable silicone adhesive composition according to any one of [1] to [4], wherein the curable organopolysiloxane contains at least a 5:95 to 95:5 mixture of the following components (A1-1) and (B1-1).

(A1-1): a linear dimethylpolysiloxane blocked by a dimethylalkenylsiloxy group at both terminals of a molecular chain; and (B1-1): a linear dimethylpolysiloxane having an alkoxysilyl-containing group bonded to silicon atoms at both terminals of a molecular chain represented by the following structural formula:

[Formula 1]

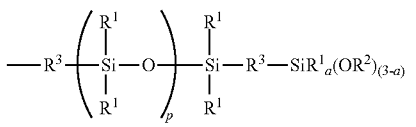

(wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50.)

[6] The liquid curable silicone adhesive composition according to any one of [1] to [5], wherein an adhesion imparting agent (E) contains at least one adhesion imparting agent selected from the group consisting of: an epoxy group-containing alkoxysilane or a partially hydrolyzed condensate thereof; a condensation reaction product of an epoxy group-containing alkoxysilane and a condensation reactive organopolysiloxane; an acrylic group-containing alkoxysilane; an amino group-containing alkoxysilane; isocyanurates; a reaction mixture of an epoxy group-containing alkoxysilane and an amino group-containing alkoxysilane; and an organic compound having at least two alkoxysilyl groups per molecule and a bond other than a silicon-oxygen bond between the silyl groups.

[7] The liquid curable silicone adhesive composition according to any one of [1] to [6], wherein a crosslinkable silane (F) is a crosslinkable silane represented by the following structural formula:

$$R^4_bSiR^5_{(4-b)}$$

(wherein $R^4$ is the same or different alkyl group having a carbon number of 1 to 10, alkenyl group having a carbon number of 2 to 10, or aryl group having a carbon number of 6 to 20, while $R^5$ is the same or different hydroxyl group, alkoxy group having a carbon number of 1 to 5, $-ONC(CH_3)C_2H_5$, $-OCOCH_3$, or $-OC(=CH_2)CH_3$, and b is 0, 1, or 2.)

[8] The liquid curable silicone adhesive composition according to any one of [1] to [7], further containing a reinforcing filler (G).

[9] The liquid curable silicone adhesive composition according to any one of [1] to [8], wherein the viscosity of the overall composition at room temperature (25° C.) before the curing reaction is within the range of 10 to 500 Pa·s.

Further, the objects of the present invention are achieved by the following high temperature curable primary cured product or cured product.

[10] A high temperature curable primary cured product obtained by primarily curing the liquid curable silicone adhesive composition according to any one of [1] to [9] within the temperature range of 60° C. or lower in the presence of moisture.

[11] A cured product obtained by heating the liquid curable silicone adhesive composition according to any one of [1] to [9] or the high temperature curable primary cured product according to [10] to 90° C. or higher.

Similarly, the object of the present invention is achieved by the following method for adhering a member for electronic equipment.

[12] A method for adhering a member for electronic equipment, using the liquid curable silicone adhesive composition according to any one of [1] to [9].

[13] A method for adhering a member for electronic equipment, the method including the following Steps (I) and (II):

Step (I): disposing the liquid curable silicone adhesive composition according to any one of [1] to [9] or the high temperature curable primary cured product according to [10] in a substrate and a member for electronic equipment; and Step (II): heating the liquid curable silicone adhesive composition or the primary cured product disposed in Step (I) to 90° C. or higher.

[14] A method for adhering a member for electronic equipment including the step by step curing of a liquid curable silicone adhesive composition having the following Steps (I') to (III'):

Step (I'): applying the liquid curable silicone adhesive composition according to any one of [1] to [9] on a substrate;

Step (II'): primarily curing the applied layer of Step (I') in the presence of moisture within the temperature range of room temperature to 60° C. or lower; and Step (III'): disposing the member for electronic equipment on the primary cured product of Step (II') and heating the member to 90° C. or higher.

Similarly, the objects of the present invention are achieved by the following electronic equipment or precursor thereof.

[15] An electronic component, electronic equipment, or a precursor thereof, including a high temperature curable primary cured product obtained by primarily curing the liquid curable silicone adhesive composition according to any one of [1] to [9] within the temperature range of 60° C. or lower in the presence of moisture

[16] The electronic component, electronic equipment, or precursor thereof according to [15], wherein the high temperature curable primary cured product is partially or completely covered with a sheet shaped member provided with a release layer

Effects of the Invention

The liquid curable silicone adhesive composition according to the present invention can form a one-part liquid curable silicone product capable of storage at room temperature for extended periods of time. Herein the initial viscosity is sufficiently low, such that the liquid composition is capable of forming a non-fluid body (primary cured product) having excellent application properties and fluidity, in addition to having no surface tack, if desired, at room temperature in the presence of moisture. A further object of the present invention is to provide a liquid curable silicone adhesive composition capable of forming a strong and good adhesive layer on various substrates by heating the liquid composition or the abovementioned primary cured product at high temperatures of 100° C. or higher. Further, the primary cured product is a non-fluid body with no surface tack and can be transported as is or as an electronic component, etc. provided with the temporarily cured product. Moreover, using the abovementioned liquid curable silicone adhesive composition according to the present invention or a high temperature curable primary cured product thereof, it is possible to provide a method for adhering a member for electronic equipment, electronic equipment provided with the cured product thereof, or a precursor thereof.

MODE FOR CARRYING OUT THE INVENTION

Liquid Curable Silicone Adhesive Composition Characteristics Based on Curing Behavior The liquid curable silicone adhesive composition according to the present invention is a liquid at room temperature and can form a non-fluid primary cured product having no surface tack at low temperatures such as room temperature (25° C.) in the presence of moisture. Further, the liquid curable silicone adhesive composition according to the present invention or the abovementioned primary cured product has high temperature curability and can form a fully cured adhesive layer by heating at 100° C. or higher. Such physical properties (curing behavior) mean that one-part product designs can be stably stored at room temperature by shielding the composition from moisture, with a relatively soft non-fluid body (primary cured product) formed without surface tack in a room temperature to low temperature region when moisture curing, while a high temperature cured product having a relatively high hardness and high rubber elasticity (hereinafter, high temperature cured products from a liquid/primary cured product are collectively referred to as a "secondary cured product at high temperatures" or simply "high temperature cured product") is formed at high temperatures of 100° C. or higher. More specifically, such physical properties can be objectively expressed by the difference in the storage modulus between primary cured products at low temperatures and secondary cured product at high temperatures. Herein regarding the storage modulus ($G'_1$) of a cured product obtained by curing the composition in the presence of moisture within a temperature range of room temperature (25° C.) to 50° C., along with the storage elastic modulus ($G'_2$) of a cured product cured by heating and curing the composition at 100° C. or higher, the increase rate (Δ) of $G'_2$ to $G'_1$ is at least 50%, while the increase rate (Δ) is suitably 100% or higher, more suitably 125% or higher. Note that the above regulation describes the curing behavior of the composition according to the present invention and does not prevent primary curing of the composition according to the present invention within the range of less than 25° C. or 50 to 60° C., or secondary curing at 100° C. or lower, for example, within the range of 90° C. to 100° C.

Here, curing behavior refers to the fact that the liquid curable silicone adhesive composition has curing reactivity in two stages (room temperature to low temperature, as well as a high temperature range of 100° C. or higher) in the presence of moisture. Further, such curing behavior is characterized in that the primary cured product obtained in the presence of moisture and at room temperature to low temperatures changes from a soft cured product to a hard cured product having higher shape retention. More specifically, the larger the increase rate (Δ) of $G'_2$ to $G'_1$ is, the more the soft and flexible primary cured product tends to be changed to a hard cured product having higher shape retention due to high temperature curing.

While not particularly limited thereto, the upper limit of the increase rate (Δ) suitably exemplified is 50,000% or less, 20,000% or less, or 10,000% or less. If the difference between the storage modulus of the primary cured product and the secondary cured product at high temperatures is less than 50%, the primary cured product may be insufficient for curing such as a gel shape or a semi-liquid, may problematically cause surface tack, and may not have sufficient flexibility, or the curing of the secondary cured product may be insufficient, preventing the object of the present invention from being achieved.

While not particularly limited thereto, the range of the storage modulus (G'1) of the cured product cured in the presence of moisture and within the temperature range of room temperature (25° C.) to 50° C., that is, the range of the storage modulus (G'1) of the primary cured product, is preferably within the range of $1.0\times10^3$ to $1.0\times10^6$ (Pa), more preferably within the range of $1.0\times10^3$ to $5.0\times10^5$ (Pa). Moreover, the primary cured product preferably has no surface tack.

The storage modulus (G'2) of the cured product obtained by curing the liquid curable silicone adhesive composition according to the present invention by heating and curing at 100° C. or higher is not particularly limited as long as the increase rate (Δ) of G'2 to the abovementioned (G'1) is at least 50%. The storage modulus (G'2) is preferably within the range of $1.0\times10^4$ to $1.0\times10^7$ (Pa), more preferably within the range of $1.0\times10^5$ to $5.0\times10^6$ (Pa) in terms of practical use and adhesive strength.

The initial viscosity of the liquid curable silicone adhesive composition according to the present invention is sufficiently low before the curing reaction, giving it favorable application properties and fluidity. Specifically, the composition preferably has a viscosity at room temperature (25° C.) of the entire composition within the range of 10 to 500 Pa·s, particularly preferably having a viscosity within the range of 10 to 300 Pa·s.

The liquid curable silicone adhesive composition according to the present invention is a composition capable of a stepwise curing behavior dependent on the physical properties and temperature as described above and contains:

100 parts by mass of a curable reactive organopolysiloxane which is the following component (Y) or a mixture of two or more types selected from the group consisting of the following components (A), (B), and (Y), and has a radical reactive group along with a condensation reactive group in the same molecule or throughout the mixture:

(A) an organopolysiloxane having at least one radical reactive group per molecule;

(B) an organopolysiloxane having at least one condensation reactive group per molecule;

(Y) an organopolysiloxane having at least one radical reactive group and at least one condensation reactive group per molecule;

(C) 0.1 to 10 parts by mass of a condensation reaction catalyst;

(D) 0.1 to 10 parts by mass of an organic peroxide;

(E) 0.1 to 10 parts by mass of an adhesion imparting agent; and (F) 0.5 to 10 parts by mass of a crosslinkable silane having at least two condensation reactive groups per molecule (except for those corresponding to component (E)).

Further, the composition preferably contains a reinforcing filler (G) and may include other additives within a range which does not impair the technical effects of the present invention. Each component will hereinafter be described in detail.

Curable Reactive Organopolysiloxane

The curing reactive organopolysiloxane is the main agent of the present composition and is characterized by having a radical reactive group and a condensation reactive group in the same molecule or throughout the mixture. Because the organopolysiloxane has a radical reactive group and a condensation reactive group, a non-fluid primary cured product having no surface tack can be formed at room temperature to 50° C. in the presence of moisture and a condensation reaction catalyst, while the primary cured product can be transported as is. Further, because the radical reactive groups derived from the organopolysiloxane remain almost unreacted in the primary cured product, heating at 100° C. or higher is carried out to form a strong adhesive layer by curing with an organic peroxide. Note that the present composition can be used as a one-part product which can be stably stored at room temperature because any curing reaction described above does not proceed at approximately room temperature in a package in which moisture is blocked.

More specifically, the curing reactive organopolysiloxane is the following component (Y) or a mixture of two or more types selected from the group consisting of the following components (A), (B), and (Y). Component (Y) alone or a mixture of two or more types of the following three types of organopolysiloxanes has a radical reactive group and a condensation reactive group in the same molecule throughout the mixture. While not particularly limited thereto, the molecular structure of these organopolysiloxanes is not particularly limited and may be linear, resinous, branched, cyclic, or combinations thereof. In addition, in these organopolysiloxanes, low molecular weight or volatile siloxane components which cause contact failure, etc. may be preferably pre-reduced or eliminated.

(A) an organopolysiloxane having at least one radical reactive group per molecule;

(B) an organopolysiloxane having at least one condensation reactive group per molecule; and (Y) an organopolysiloxane having at least one radical reactive group and at least one condensation reactive group per molecule Component (A)

Component (A) is an organopolysiloxane having at least one radical reactive group per molecule and serving as the component for imparting high temperature curability to the present composition particularly at 100° C. or higher. While not particularly limited thereto, examples of such radical reactive groups include: alkenyl groups having a carbon number of 2 to 10 such as vinyl groups, allyl groups, butenyl groups, pentenyl groups, hexenyl groups, and heptenyl groups; acryl-containing organic groups such as 3-acryloxypropyl groups; and methacryl-containing organic groups such as 3-methacryloxypropyl groups, with alkenyl groups particularly preferable. The molecular structure of component (A) is not particularly limited and may be linear, resinous, branched, cyclic, or combinations thereof.

Because the present composition contains the condensation reactive component (B) or (Y), and component (F), component (A) may be at least one radical reactive group per molecule. However, in terms of high temperature curability, component (A) preferably has two or more radical reactive groups per molecule, and particularly preferably has two or more radical reactive groups at the terminals of molecules (molecular terminals in the case of chain molecules).

Examples of component (A), as functional groups bonded to silicon atoms other than the abovementioned radical reactive groups, include: alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenethyl group, and phenylpropyl group; halogenated alkyl groups such as a 3-chloropropyl group and 3,3,3-trifloropropyl group, with an alkyl group, cycloalkyl group, and aryl group preferable and a methyl group and phenyl group particularly preferable. That said, component (A) is not particularly limited as long as it is within a range such that it does not overlap component (B) or (Y) and does not impair the technical effects of the present invention, with component (A) potentially including a carbosiloxane dendrimer structure or siloxane macromonomer bonded to the molecule via an alkylene group. Industrially, examples of functional groups bonded to silicon atoms other than the radical reactive groups described above include fluoroalkyl groups such as methyl groups, phenyl groups, and trifluoroalkyl groups.

The molecular structure, molecular weight, degree of polymerization, viscosity of siloxane units, and viscosity of component (A) are not particularly limited, with examples thereof including organopolysiloxanes selected from linear, resinous, branched, cyclic, or combinations thereof, such that the properties at 25° C. may be oil or raw rubber, with the viscosity thereof being at least 5 mPa·s or more, 10 mPa·s or more, or 20 mPa·s or more. The upper limit of the viscosity thereof is not particularly limited, with raw rubber potentially having a viscosity of 100,000 mPa·s or more at 25° C., or plasticity, wherein the viscosity at 25° C. is preferably 100,000 mPa·s or less and 50,000 mPa·s or less.

Examples of component (A) which are linear organopolysiloxanes include: a dimethylsiloxane/methylvinylsiloxane copolymer blocked by a trimethylsiloxy group at both terminals of a molecular chain, a dimethylsiloxane/methylvinylsiloxane/methylphenylsiloxane copolymer blocked by a trimethylsiloxy group at both terminals of a molecular chain, a dimethylpolysiloxane blocked by a dimethylvinylsiloxy group at both terminals of a molecular chain, a methylphenylpolysiloxane blocked by a dimethylvinylsiloxy group at both terminals of a molecular chain, a dimethylsiloxane/methylvinylsiloxane copolymer blocked by a dimethylvinylsiloxy group at both terminals of a molecular chain, a dimethylsiloxane/methylvinylsiloxane copolymer blocked by a dimethylphenylsiloxy group at both terminals of a molecular chain, and a dimethylpolysiloxane blocked by a methylvinylphenylsiloxy group at both terminals of a molecular chain. Moreover, some or all of these vinyl groups may be substituted with other alkenyl groups such as hexenyl groups or the abovementioned acryl group-containing organic groups or methacryl group-containing organic groups.

If component (B) is a resinous organopolysiloxane, examples thereof may include a resin composed of $R_2SiO_{2/2}$ units (D units) and $RSiO_{3/2}$ units (T units) (wherein each R is independently a monovalent organic group, suitably an alkyl group having a carbon number of 1 to 10, a phenyl group, or an alkenyl group having a carbon number of 2 to 10) and having at least one radical reactive group per molecule, a resin composed of the T units alone and having at least one radical reactive group per molecule, and a resin composed of $R_3SiO_{1/2}$ units (M units) and $SiO_{4/2}$ units (Q units) and having at least one radical reactive group per molecule, etc. In particular, it is preferable to use a resin (also referred to as MQ resin) composed of $R_3SiO_{1/2}$ units (M units) and $SiO_{4/2}$ units (Q units) and having at least one radical reactive group per molecule.

Component (B)

Component (B) is an organopolysiloxane having at least one condensation reactive group per molecule and is a component which imparts primary curability to the present composition in the presence of moisture and a condensation reaction catalyst within the temperature range of 60° C. or lower, suitably 50° C. or lower, and more suitably room temperature (25° C.) to 50° C. or lower. While not particularly limited thereto, such a condensation reactive group is preferably a functional group having a hydroxyl group, an alkoxy group with a carbon number of 1 to 10, or a carboxyl group, and is preferably a hydroxyl group (silanol group) bonded to silicon atoms or an alkoxysilyl group having one or more alkoxy groups. In terms of primary curability at room temperature (25° C.) to 50° C., component (B) preferably has at least one alkoxysilyl group per molecule. Moreover, while not particularly limited thereto, the molecular structure of component (B) may be linear, resinous, branched, or combinations thereof. In addition, in these organopolysiloxanes, low molecular weight or volatile siloxane components which cause contact failure, etc. may be preferably pre-reduced or eliminated.

In component (B), a suitable condensation reactive group is a silanol group or an alkoxy group having a carbon number of 1 to 5, particularly preferably having an alkoxysilyl-containing group represented by the general formula:

[Formula 2]

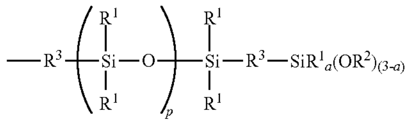

(wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50.)

In the above formula, $R^1$ represents the same or different monovalent hydrocarbon group not having an aliphatic unsaturated bond, with examples thereof including: alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenethyl group, and phenylpropyl group; halogenated alkyl groups such as a 3-chloropropyl group and 3,3,3-trifloropropyl group, with an alkyl group and aryl group preferable, with a methyl group and phenyl group particularly preferable. Moreover, in the above formula, $R^2$ is an alkyl group, with examples thereof including a methyl group, ethyl group, propyl group, butyl group, pentyl group, and hexyl group, with a methyl group preferable. $R^3$ is the same or different divalent organic group, with examples thereof including: alkylene groups such as an ethylene group, propylene group, butylene group, pentylene group, hexylene group, heptylene group, and octylene group; and alkylene oxyalkylene groups such as an ethyleneoxyethylene group, propyleneoxyethylene group, and propyleneoxypropylene group. Herein an alkylene group is preferable, while an ethylene group is particularly preferable. Moreover, in the above formula, p is an integer of 1 to 50, preferably an integer of 1 to 10, particularly preferably an integer of 1 to 5. Moreover, in the above formula, a is an integer of 0 to 2, preferably 0.

Examples of such alkoxysilyl-containing groups include groups represented by the formula:

Examples of the alkoxysilyl-containing group represented by the abovementioned general formula include a group represented by the formula:

[Formula 3]

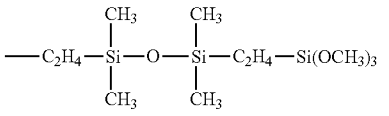

a group represented by the formula:

[Formula 4]

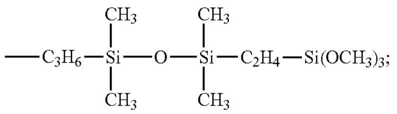

a group represented by the formula:

[Formula 5]

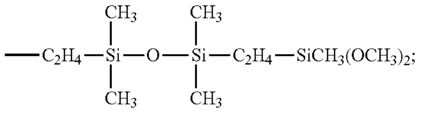

a group represented by the formula:

[Formula 6]

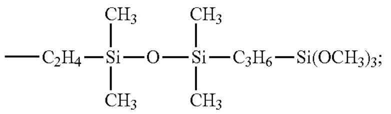

a group represented by the formula:

[Formula 7]

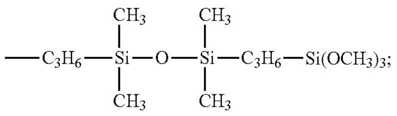

a group represented by the formula:

[Formula 8]

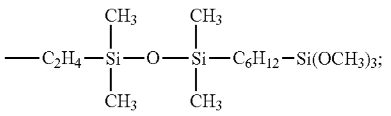

a group represented by the formula:

[Formula 9]

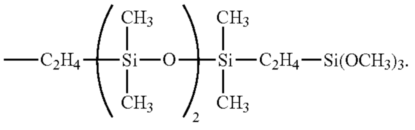

Because the present composition contains condensation reactive component (F), component (B) may have at least one condensation reactive group per molecule. However, in terms of primary curability, component (B) preferably has two or more condensation reactive groups per molecule, particularly preferably having two or more condensation reactive groups at molecular terminals (terminals of a molecular chain in the case of chain molecules), and more suitably one or more types of terminal groups selected from alkoxysilyl groups having a carbon number of 1 to 5 such as the above-mentioned silanol group and trimethoxysilyl group, and an alkoxysilyl-containing group represented by the abovementioned general formula.

Examples of component (B), as functional groups bonded to silicon atoms other than the abovementioned condensation reactive groups, include: alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenethyl group, and phenylpropyl group; halogenated alkyl groups such as a 3-chloropropyl group and 3,3,3-trifloropropyl group, with an alkyl group, cycloalkyl group, and aryl group preferable, with a methyl group and phenyl group particularly preferable. However, component (B) is not particularly limited as long as it is within the range which does not overlap component (A) or (Y) and does not impair the technical effects of the present invention, with component (B) potentially including a carbosiloxane dendrimer structure or siloxane macromonomer bonded into the molecule via an alkylene group. Industrially, examples of functional groups bonded to silicon atoms other than the condensation reactive groups described above include perfluoroalkyl groups such as methyl groups, phenyl groups, and trifluoroalkyl groups.

The molecular structure, molecular weight, degree of polymerization, viscosity of siloxane units, and viscosity of component (B) are not particularly limited, with examples thereof including organopolysiloxanes selected from linear, resinous, branched, cyclic, or combinations thereof, such that the properties at 25° C. may be oil or raw rubber, with the viscosity thereof being at least 5 mPa·s or more, 10 mPa·s or more, or 20 mPa·s or more. The upper limit of the viscosity thereof is not particularly limited, with raw rubber potentially having a viscosity of 100,000 mPa·s or more at 25° C., or plasticity, wherein the viscosity at 25° C. is preferably 100,000 mPa·s or less and 50,000 mPa·s or less.

If the molecular structure of component (B) is linear, an organopolysiloxane having one or more types of terminal groups selected from alkoxysilyl groups having a carbon number of 1 to 5, such as the silanol groups and trimethoxysilyl groups, and alkoxysilyl groups represented by the abovementioned general formula, in silicon atoms of at least one terminal of a molecular chain, are preferable.

If component (B) is a resinous organopolysiloxane, examples thereof may include a resin composed of $R_2SiO_{2/2}$ units (D units) and $RSiO_{3/2}$ units (T units) (wherein each R is independently a monovalent organic group or a hydroxyl group) and having at least one condensation reactive group per molecule, a resin composed of the T units alone and having at least one condensation reactive group per molecule, and a resin composed of $R_3SiO_{1/2}$ units (M units) and $SiO_{4/2}$ units (Q units) and having at least one condensation reactive group per molecule, etc. In particular, it is preferable to use a resin (also referred to as MQ resin) composed of $R_3SiO_{1/2}$ units (M units) and $SiO_{4/2}$ units (Q units) and having at least one condensation reactive group per molecule. Note that the condensation reactive group may be a hydroxyl group or an alkoxy group having a carbon number of 1 to 5, such that these are directly bonded to silicon of the T units or Q units in the resin and are groups derived from silane as a raw material or generated as a result of hydrolysis of silane.

Component (Y)

Component (Y) is an organopolysiloxane having one radical reactive group and at least one condensation reactive group per molecule and is a component which imparts primary curability to the present composition in the presence of moisture and a condensation reaction catalyst within the temperature range of 60° C. or lower, suitably 50° C. or lower, and more suitably room temperature (25° C.) to 50° C. or lower, in addition to also being a component which imparts high temperature curability to the present composition at a temperature of 90° C. or higher, suitably 100° C. or higher in the presence of peroxide. Here, the type and suitable range of radical reactive groups and condensation reactive groups are as exemplified in the abovementioned components (A) or (B). Moreover, other functional groups other than the radical reactive groups and condensation reactive groups in component (Y) are also as exemplified in components (A) or (B).

The molecular structure, molecular weight, degree of polymerization, viscosity of siloxane units, and viscosity of component (Y) are not particularly limited, with examples thereof including organopolysiloxanes selected from linear, resinous, branched, cyclic, or combinations thereof, such that properties at 25° C. may be oil or raw rubber, with the viscosity thereof being at least 5 mPa·s or more, 10 mPa·s or more, or 20 mPa·s or more. The upper limit of the viscosity thereof is not particularly limited, such that a raw rubber may have a viscosity of 100,000 mPa·s or more at 25° C., or plasticity, wherein the viscosity at 25° C. is preferably 100,000 mPa·s or less and 50,000 mPa·s or less.

Moreover, if component (Y) is a linear organopolysiloxane, the viscosity of component (A) at 25° C. is not particularly limited, and is, for example, preferably 20 or more, particularly preferably within the range of 100 to 1,000,000 mPa·s. This is because when the viscosity is low, the physical properties of the obtained cured product, particularly flexibility and elongation, are significantly deteriorated.

Examples of such component (Y) include: an organopolysiloxane represented by the average formula:

[Formula 10]

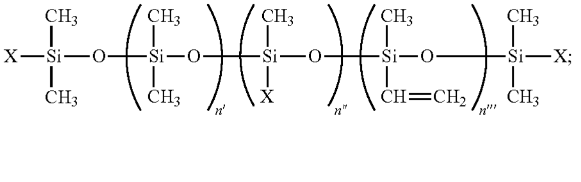

an organopolysiloxane represented by the average formula:

[Formula 11]

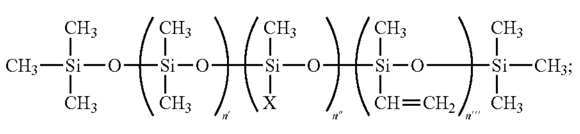

an organopolysiloxane represented by the average formula:

[Formula 12]

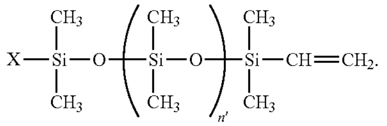

Note that, in the formula, X is the exemplified condensation reactive group and is preferably one or more types of functional groups selected from alkoxysilyl groups having a carbon number of 1 to 5 such as the silanol groups and trimethoxysilyl groups, and alkoxysilyl-containing groups represented by the abovementioned general formula. Moreover, some or all of the abovementioned vinyl groups may be substituted with other alkenyl groups such as hexenyl groups or the abovementioned acryl group-containing organic groups or methacryl group-containing organic groups. Here, n', n", and n'" are each integers of 1 or more and are preferably values satisfying the viscosity range described above.

If component (Y) is a resinous organopolysiloxane, examples thereof may include a resin composed of $R_2SiO_{2/2}$ units (D units) and $RSiO_{3/2}$ units (T units) (wherein each R is independently a monovalent organic group or a hydroxyl group) and having at least one condensation reactive group and at least one radical reactive group per molecule, a resin composed of the T units alone and having at least one condensation reactive group and at least one radical reactive group per molecule, and a resin composed of $R_3SiO_{1/2}$ units (M units) and $SiO_{4/2}$ units (Q units) and having at least one condensation reactive group and at least one radical reactive group per molecule, etc. In particular, it is preferable to use a resin (also referred to as MQ resin) composed of $R_3SiO_{1/2}$ units (M units) and $SiO_{4/2}$ units (Q units) and having at least one condensation reactive group and at least one radical reactive group per molecule. Note that the condensation reactive group may be a group selected from at least one hydroxyl group, an alkoxy group having 1 to 5 carbon atoms, etc., wherein the at least one radical reactive group is preferably an alkenyl group such as a vinyl group.

Such a resin component (Y) has a hydroxyl group or an alkoxy group having a carbon number of 1 to 5 per molecule, with examples thereof including MQ resin, MDQ resin, MTQ resin, MDTQ resin, TD resins, TQ resin, TDQ resin, each of which consists of: any combination of triorganosiloxy units (M units) (the organo group is a methyl group alone, a methyl group and a vinyl group, or a phenyl group); diorganosiloxy units (D units) (the organo group is a methyl group alone, a methyl group and a vinyl group, or a phenyl group); mono-organosiloxane units (T units) (the organo group is a methyl group, a vinyl group, or a phenyl group); and siloxy units (Q units).

On the other hand, particularly preferable examples of resin component (Y) include MQ resin type organopolysiloxanes represented by the following structural formula.

Structural formula:

$$[(CH_3)_3SiO_{1/2}]_b[(CH_3)_2(CH_2{=}CH)SiO_{1/2}]_c[(CH_3)_2XSiO_{1/2}]_d(SiO_{4/2})_e$$

Note that, in the formula, X is the exemplified condensation reactive group and is preferably one or more types of functional groups selected from alkoxysilyl groups having a carbon number of 1 to 5 such as the abovementioned silanol groups and trimethoxysilyl groups, and alkoxysilyl-containing groups represented by the abovementioned general formula. Moreover, some or all of the abovementioned vinyl groups may be substituted with other alkenyl groups such as hexenyl groups or the abovementioned acryl group-containing organic groups or methacryl group-containing organic groups. Here, b, c, d, and e are positive numbers.

The curing reactive organopolysiloxane according to the present invention is preferably selected from the following component (Y1) or mixtures of two or more types selected from the group consisting of the following components (A1), (B1), and (Y1). Specific examples thereof are as exemplified in components (A), (B), and (Y) described above. The mixing ratio of components (A), (B), and (Y) is optional.

(A1): a methylpolysiloxane having at least one alkenyl group per molecule;

(B1): a methylpolysiloxane having at least one alkoxysilyl-containing group per molecule; and (Y1): a methylpolysiloxane having at least one alkenyl group and at least one alkoxysilyl-containing group per molecule.

The curing reactive organopolysiloxane according to the present invention preferably includes components (A) and (B) and particularly preferably includes at least a 5:95 to 95:5 mixture of the following components (A1-1) and (B1-1). Suitable examples of components (A1-1) and (B1-1) are as described in the abovementioned component (A) or (B).

(A1-1): a linear dimethylpolysiloxane blocked by a dimethylalkenylsiloxy group at both terminals of a molecular chain; and (B1-1): a linear dimethylpolysiloxane having an alkoxysilyl-containing group bonded to silicon atoms at both terminals of a molecular chain by the following structural formula:

[Formula 13]

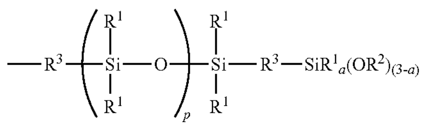

(wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50.)

Note that in addition to these components, any number of component (Y) may be further included.

Component (C)

Component (C) is a condensation reaction catalyst and is a component which imparts primary curability to the composition according to the present invention within the temperature range of 60° C. or lower, suitably 50° C. or lower, and more suitably from room temperature (25° C.) to 50° C. or lower, by promoting the condensation reaction of components (B), (Y), and (F) of the composition according to the present invention. Examples of such component (C) include: organotin compounds such as dibutyltin dilaurate, dibutyltin diacetate, tin octene, dibutyltin dioctate, tin laurate, dimethyl tin dineodecanoate, and stannous octoate; organic titanium compounds such as tetra(isopropoxy)titanium, tetra(n-butoxy)titanium, tetra(t-butoxy)titanium, di(isopropoxy)bis(ethylacetoacetate)titanium, di(isopropoxy)bis(methylacetoacetate)titanium, di(isopropoxy)bis(acetylacetonate)titanium, tetrabutyl titanate, tetrapropyl titanate, and dibutoxybis(ethylacetoacetate); acidic compounds such as hydrochloric acid, sulfuric acid, and dodecylbenzene sulfonic acid; alkaline compounds such as ammonia and sodium hydroxide; and amine based compounds such as 1,8-diazabicyclo[5.4.0]undecene (DBU) and 1,4-diazabicyclo[2.2.2]octane (DABCO). The amount used is the catalytic amount, can be appropriately selected in accordance with the desired curing conditions, and is generally within the range of 0.1 to 10 parts by mass, preferably within the range of 0.1 to 5 parts by mass, with respect to 100 parts by mass of the total of the curable reactive organopolysiloxane in the overall composition.

Component (D)

Component (D) is an organic peroxide and is a component which imparts high temperature curability at 100° C. or higher for component (A) or (Y) of the composition according to the present invention, or the primary cured product of the present composition. Examples of such organic peroxides include alkyl peroxides, diacyl peroxides, ester peroxides, and carbonate peroxides. In particular, when curing of the present composition or the primary cured product of the present composition is allowed to proceed selectively at high temperatures, the 10-hour half-life temperature of the organic peroxide is preferably 70° C. or higher, but may be 90° C. or higher.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide such as p-methylbenzonyl peroxide, lauroyl peroxide and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate. Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

The organic peroxides preferably have a 10-hour half-life temperature of 70° C. or higher, but may be 90° C. or higher, or may be 95° C. or higher. Examples of such organic peroxides include p-methylbenzonyl peroxide, dicumyl peroxide, di-tert-butyl peroxide, di-tert-hexyl peroxide, tert-butylcumyl peroxide, 2,5-dimethyl-2,5-di(tert-butylperoxy) hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of organic peroxide is generally within the range of 0.1 to 10 parts by mass, preferably within the range of 0.1 to 5 parts by mass, with respect to 100 parts by mass of the total of the curable reactive organopolysiloxane in the overall composition.

Component (E)

Component (E) is an adhesion imparting agent and is a component which provides excellent adhesiveness (including improvement in adhesion durability and adhesive strength) to a cured product obtained after high temperature curing of the composition according to the present invention or the primary cured product thereof at 100° C. or higher. In particular, when the composition according to the present invention is used as a protective agent or adhesive for electrical and electronic components, the initial adhesiveness to various types of substrates such as aluminum die-casts and resin materials is excellent, adhesion durability and adhesive strength are further improved, and the reliability and durability of the electrical and electronic components can be maintained over extended periods of time.

While not particularly limited thereto, such component (E) suitably contains at least one adhesion imparting agent selected from the group consisting of: an epoxy group-containing alkoxysilane or a partially hydrolyzed condensate thereof; a condensation reaction product of an epoxy group-containing alkoxysilane and a condensation reactive organopolysiloxane; an acrylic group-containing alkoxysilane; an amino group-containing alkoxysilane; alkenylisocyanurates; a reaction mixture of an epoxy group-containing alkoxysilane and an amino group-containing alkoxysilane; and an organic compound having at least two alkoxysilyl groups per molecule and a bond other than a silicon-oxygen bond between the silyl groups. As other components (E), an alkyl silicate such as methyl polysilicate, ethyl polysilicate, or epoxy group-containing ethyl polysilicate may be used.

The adhesion imparting agents may be one type or more, but it is preferable to use two or more types of adhesion imparting agents and particularly preferable to use three or more types of adhesion imparting agents because a strong adhesive layer can be formed on the substrate or member contacted by the cured product obtained after high temperature curing at 90° C. or higher and preferably 100° C. or higher. The adhesion imparting agent is preferably in the form of a low viscosity liquid and while the viscosity thereof is not limited, it is preferably within the range of 1 to 500 mPa·s at 25° C. In addition, the content of this adhesion imparting agent is generally within the range of 0.1 to 10 parts by mass, preferably within the range of 0.1 to 5 parts by mass, with respect to 100 parts by mass of the total of the curable silicone composition.

In particular, while not limited thereto, suitable combinations of adhesion imparting agents include: an adhesion imparting agent of (e1) a reaction mixture between an epoxy group-containing alkoxysilane and an amino group-containing alkoxysilane;

(e2) a condensation reaction product of an epoxy group-containing alkoxysilane and a condensation reactive organopolysiloxane; and (e3)isocyanates, which are mixed at a mass ratio of (e1):(e2):(e3)=1:0.1 to 5:0.1 to 5, more preferably (e1):(e2):(e3)=1:1 to 5:1 to 5, with sufficient adhesiveness and adhesive strength capable of being achieved even with one type of adhesion imparting agent.

The epoxy group-containing alkoxysilane is an epoxy group-containing silane represented by the general formula:

$$R^a_n Si(OR^b)_{4-n}$$

(wherein $R^a$ is a monovalent epoxy group-containing organic group, $R^b$ is an alkyl group having a carbon number of 1 to 6, or a hydrogen atom, and n is a number within the range of 1 to 3)

or a partially hydrolyzed condensate thereof, independently improves initial adhesiveness, and enhances the adhesive durability under particularly harsh conditions in combination with other adhesion imparting agents. Note that while the epoxy group-containing alkoxysilane is one component (raw material) of another adhesion imparting agent, in terms of technical effects, it may be preferable to add the epoxy group-containing alkoxysilane as a separate component.

Exemplary epoxy group containing silanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

The condensation reaction product of an epoxy group-containing alkoxysilane and a condensation reactive organopolysiloxane is a condensation reaction product of a chain or resinous organopolysiloxane having the abovementioned epoxy group-containing alkoxysilane and a condensation reactive group (for example, a silanol group, an alkoxy group, and an alkoxysilyl-containing group). Herein the condensation reaction ratio may be within the range of 1:9 to 9:1 in terms of mass ratio, but is more preferably within the range of 2:8 to 8:2 in terms of mass ratio. In addition, in terms of the viscosity control of the adhesion imparting agent, the condensation reactive organopolysiloxane is particularly preferably within the range of 5 to 100 mPa·s at 25° C. The condensation reaction catalyst and reaction conditions can be designed as desired.

Exemplary acrylic group-containing alkoxysilanes include 3-methacryloxypropyltrimethoxysilane, 3-methacryloxypropyltriethoxysilane, 3-acryloxypropyltrimethoxysilane, etc.

Exemplary amino group-containing alkoxysilanes may include an aminomethyltriethoxysilane, 3-aminopropyltrimethoxysilane, 3-aminopropyltriethoxysilane, 3-aminopropylmethyldimethoxysilane, N-(2-aminoethyl)aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane, and N-phenyl-3-aminopropyltrimethoxysilane.

The isocyanurates are isocyanurates or modified products thereof and include triallyl isocyanurate, tributenyl isocyanurate, tripinyl isocyanurate, tricyclohexenyl isocyanurate, tri methoxysilylpropyldiallyl isocyanurate, bis(trimethoxysilylpropyl)allyl isocyanurate, triethoxysilylpropyldiallyl isocyanurate, an isocyanuric acid derivative (for example, as disclosed in JP 2010-065161 A) having (i) one or more functional group selected from an epoxy group, a glycidoxy group, and an alkoxysilyl group, along with an alkenyl group, in the same molecule, etc.

The reaction mixture of the epoxy group-containing organoalkoxysilane and the amino group-containing organoalkoxysilane is a component for imparting initial adhesiveness to various types of substrates which are in contact during curing, particularly adhesiveness to an unwashed adherend. Moreover, some curing systems of a curable composition obtained by blending this adhesion promoter may act as a crosslinking agent. Such a reaction mixture is disclosed in JP 52-8854 B and JP 10-195085 A.

The epoxy group-containing organoalkoxysilane and the amino group-containing organoalkoxysilane, which serve as raw materials, are the same as described above. Herein the ratio as a molar ratio of (amino group-containing organoalkoxysilane:epoxy group-containing organoalkoxysilane) is preferably within the range of (1:1.5) to (1:5), particularly preferably within the range of (1:2) to (1:4). This component (e1) can be easily synthesized by mixing alkoxysilane having an amino group containing organic group and alkoxysilane having an epoxy group containing organic group as mentioned above to cause them to react at room temperature or under heating.

In particular, when an alkoxysilane having an amino group-containing organic group is reacted with an alkoxysilane having an epoxy group-containing organic group by the method described in JP 10-195085 A, the present invention particularly preferably contains a carbasilatrane derivative obtained by cyclizing and represented by the general formula:

[Formula 14]

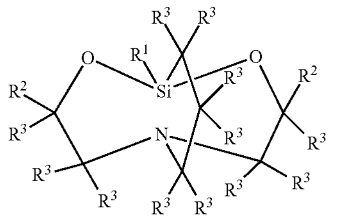

{wherein $R^1$ is an alkyl group or an alkoxy group, and $R^2$ is the same or different group selected from the group consisting of groups represented by the general formula:

[Formula 15]

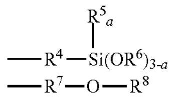

(wherein $R^4$ is an alkylene group or alkyleneoxyalkylene group, $R^5$ is a monovalent hydrocarbon group, $R^6$ is an alkyl group, R7 is an alkylene group, $R^8$ is an alkyl group, alkenyl group, or acyl group, and a is 0, 1, or 2.)

$R^3$ is the same or different hydrogen atom or alkyl group.}

Exemplary carbasilatrane derivatives may include a silatrane derivative having an alkenyl group and silicon atom-bonded alkoxy group per one molecule represented by the following structure.

[Formula 16]

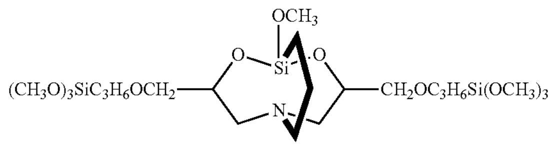

It is an organic compound having at least two alkoxysilyl groups per molecule, in addition to containing bonds other than a silicon-oxygen bond between these silyl groups, and can independently improve initial adhesiveness, along with further improving the adhesive durability to a high temperature cured product under harsh conditions particularly when used in combination with other adhesion imparting agents.

Such an organic compound is suitably a disilane alkane compound represented by the following general formula:

[Formula 17]

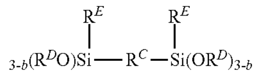

(wherein $R^C$ is a substituted or unsubstituted alkylene group having a carbon number of 2 to 20, each $R^D$ is independently an alkyl group or alkoxyalkyl group, each $R^E$ is independently a monovalent hydrocarbon group, and each b is independently 0 or 1.) Such components are commercially available as reagents or products in various compounds and can be synthesized using a well-known method such as a Grignard reaction or hydrosilylation reaction. For example, the component can be synthesized via a well-known method by a hydrosilylation reaction between diene and trialkoxysilane or organodialkoxysilane.

In the formula, $R^E$ is a monovalent hydrocarbon group including: an alkyl group such as a methyl group, ethyl group, or propyl group; an alkenyl group such as a vinyl group or allyl group; and an aryl group such as a phenyl group, with a lower alkyl group preferable. $R^D$ is an alkyl group such as a methyl group, ethyl group, or propyl group, or an alkoxyalkyl group such as a methoxyethyl group, preferably having a carbon number of 4 or less. $R^C$ is a substituted or unsubstituted alkylene group, with a linear or branched alkylene group used without limitation, and may be a mixture thereof. In terms of improving adhesiveness, a linear and/or branched alkylene group having a carbon number of 2 to 20 is preferable, with a linear and/or branched alkylene having a carbon number of 5 to 10, particularly hexylene having a carbon number of 6, more preferable. The unsubstituted alkylene group may be a butylene group, pentylene group, hexylene group, heptylene group, octylene group, nonylene group, decylene group, or a branched structure thereof, with the hydrogen atom capable of being substituted with a methyl group, ethyl group, propyl group, butyl group, cyclopentyl group, cyclohexyl group, vinyl group, allyl group, 3,3,3-trifluoropropyl group, or 3-chloropropyl group.

Specific examples of the abovementioned organic compound may include bis(trimethoxysilyl)ethane, 1,2-bis(trimethoxysilyl)ethane, 1,2-bis(triethoxysilyl)ethane, 1,2-bis(methyldimethoxysilyl)ethane, 1,2-bis(methyldiethoxysilyl)ethane, 1,1-bis(trimethoxysilyl)ethane, 1,4-bis(trimethoxysilyl)butane, 1,4-bis(triethoxysilyl)butane, 1-methyldimethoxysilyl-4-trimethoxysilylbutane, 1-methyldiethoxysilyl-4-triethoxysilylbutane, 1,4-bis(methyldimethoxysilyl)butane, 1,4-bis(methyldiethoxysilyl)butane, 1,5-bis(trimethoxysilyl)pentane, 1,5-bis(triethoxysilyl)pentane, 1,4-bis(trimethoxysilyl)pentane, 1,4-bis(triethoxysilyl)pentane, 1-methyldimethoxysilyl-5-trimethoxysilylpentane, 1-methyldiethoxysilyl-5-triethoxysilylpentane, 1,5-bis(methyldimethoxysilyl)pentane, 1,5-bis(methyldiethoxysilyl)pentane, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, 1,6-bis(methyldimethoxysilyl)hexane, 1,7-bis(trimethoxysilyl)heptane, 2,5-bis(trimethoxysilyl)heptane, 2,6-bis(trimethoxysilyl)heptane, 1,8-bis(trimethoxysilyl)octane, 2,5-bis(trimethoxysilyl)octane, 2,7-bis(trimethoxysilyl)octane, 1,9-bis(trimethoxysilyl)nonane, 2,7-bis(trimethoxysilyl)nonane, 1,10-bis(trimethoxysilyl)decane, and 3,8-bis(trimethoxysilyl)decane. These can be used independently or as a mixture of two or more types thereof. In the present invention, 1,6-bis(trimethoxysilyl)hexane, 1,6-bis(triethoxysilyl)hexane, 1,4-bis(trimethoxysilyl)hexane, 1,5-bis(trimethoxysilyl)hexane, 2,5-bis(trimethoxysilyl)hexane, 1-methyldimethoxysilyl-6-trimethoxysilylhexane, 1-phenyldiethoxysilyl-6-triethoxysilylhexane, and 1,6-bis(methyldimethoxysilyl)hexane can be suitably exemplified.

Component (F)

Component (F) is one crosslinking agent component of the present composition and is a crosslinkable silane which does not correspond to the abovementioned component (E). Such a crosslinkable silane has at least two condensation reactive groups per molecule due to the crosslinking structure (crosslinking point) between molecules, but particularly has the following structural formula:

$$R^4_bSiR^5_{(4-b)}$$

(wherein $R^4$ is the same or different alkyl group having a carbon number of 1 to 10, alkenyl group having a carbon number of 2 to 10, or aryl group having a carbon number of 6 to 20, while $R^5$ is the same or different hydroxyl group, alkoxy group having a carbon number of 1 to 5, $—ONC(CH_3)C_2H_5$, $—OCOCH_3$, or $—OC(=CH_2)CH_3$, and b is 0, 1, or 2.)

In addition, the content of the crosslinkable silane is generally within the range of 0.1 to 10 parts by mass, preferably within the range of 0.1 to 5 parts by mass, with respect to 100 parts by mass of the total of the curable reactive organopolysiloxane.

Specific examples of component (F) include: trifunctional alkoxysilanes such as methyltrimethoxysilane, methyltriethoxysilane, ethyltrimethoxysilane, ethyltriethoxysilane, vinyltrimethoxysilane, and phenyltrimethoxysilane; tetrafunctional alkoxysilanes such as tetramethoxysilane and tetraethoxysilane; and ketoxime silanes such as vinyltris(methylethylketoxime)silane, phenyltris(methylethylketoxime)silane, vinyltris(methylisobutylketoxime)silane, phenyltris(methylisobutylketoxime)silane, vinyltris(diisopropylketoxime silane), and phenyltris(diisopropylketoxime)silane. These may be used alone or two or more thereof may be used in combination.

Component (G)

The composition according to the present invention optionally preferably contains a reinforcing filler (G). The reinforcing filler is a component which imparts mechanical strength to a cured product obtained by curing the composition according to the present invention at room temperature, etc. in the presence of moisture, along with a cured product obtained by curing at high temperatures, and is a component which improves thixotropy. Herein, specifically, the abovementioned primary cured product may be able to suppress the softening of the primary cured product relative to heating, etc. (when the primary cured product is subjected to a curing reaction at high temperatures of 90° C. or higher, suitably 100° C. or higher), in addition to suppressing the resultant deterioration of the primary cured product or the deformation thereof. This is effective in efficiently suppressing the state in which the electronic component or the like arranged on this primary cured product is buried in the cured product or in which it is difficult to separate the electronic component or the like from the cured layer. In addition, the blending of the reinforcing filler may further improve the mechanical strength, shape retention, and surface releasability of the cured product following the curing reaction under a high temperature of 100° C. or higher.

Examples of such reinforcing fillers include inorganic fillers such as fumed silica fine powder, precipitated silica fine powder, calcined silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, and zinc carbonate fine powder. The reinforcing fillers may contain inorganic fillers obtained by surface hydrophobizing these inorganic fillers with a treating agent including organoalkoxysilanes such as methyltrimethoxysilane, organohalosilanes such as trimethylchlorosilane, organosilanes such as hexamethyldisilazane, siloxane oligomers such as α,ω-silanol group-blocked dimethylsiloxane oligomer, α,ω-silanol group-blocked methylphenylsiloxane oligomer, and α,ω-silanol group-blocked methylvinylsiloxane oligomer, and the like. In particular, by treating the surface of component (G) in advance with an organopolysiloxane of a low degree of polymerization having a silanol group at both terminals of a molecular chain (suitably, a dimethylpolysiloxane blocked by an α,ω-silanol group not having reactive functional groups other than this terminal silanol group in molecules), excellent initial adhesiveness, adhesive durability, and adhesive strength at room temperature can be achieved, with further sufficient usable time (storage period, handling operation time, and pot life) capable of being ensured.

While not particularly limited thereto, the particle diameter of fine powder of the reinforcing filler may be, for example, within the range of 0.01 μm to 1000 μm at the median diameter based on the laser diffraction/scattering type particle size distribution measurement (hereinafter, simply referred to as the "median diameter").

While not limited thereto, the content of the reinforcing filler is preferably within the range of 0.1 to 200 parts by mass with respect to 100 parts by mass of the curable reactive organopolysiloxane.

Other Components

To the extent that the technical effect of the present invention is not impaired, the liquid curable silicone adhesive composition may include components other than those described above. For example, the composition may include: a curing retardant; a non-reactive organopolysiloxane such as polydimethylsiloxane or polydimethyldiphenylsiloxane; an antioxidant such as a phenol type, quinone type, amine type, phosphorus type, phosphite type, sulfur type, or thioether type; a light stabilizer such as a triazole type or benzophenone type; a flame retardant such as a phosphate ester type, halogen type, phosphorus type, or antimony type; one or more antistatic agents consisting of a cationic surfactant, anionic surfactant, or non-ionic surfactant, and the like; a heat resistant agent such as iron oxide; a dye; a pigment; a pigment; a thermoconductive filler; a dielectric filler; an electrically conductive filer; a releasable component; a thixotropy imparting agent; an antifungal agent; etc.

The thermally conductive filler or electrically conductive filler is a component which imparts thermal conductivity or electrical conductivity to the silicone rubber cured product obtained by curing the present composition as desired and is exemplified by: a fine metal powder such as gold, silver, nickel, copper, or the like; a fine powder obtained by depositing or plating a metal such as gold, silver, nickel, copper, or the like on the surface of a fine powder such as boron nitride, ceramic, glass, quartz, organic resin, or the like; a metal compound such as aluminum oxide, aluminum nitride, zinc oxide, or the like; and a mixture of two or more of these. Particularly preferred are silver powder, aluminum powder, aluminum oxide powder, zinc oxide powder, aluminum nitride powder, boron nitride powder, or graphite. When electrical insulation is required for the present composition, a metal oxide powder or a metal nitride powder is preferable, with aluminum oxide powder, zinc oxide powder, boron nitride powder, or aluminum nitride powder being particularly preferable. Further, the thermally conductive filler or the electrically conductive filler is preferably heated and mixed with the above component (B) and the like at a temperature of 100 to 200° C. under reduced pressure. In particular, if component (B) is a siloxane having an alkoxysilyl containing group, surface treatment of a thermally conductive filler or an electrically conductive filler can provide a composition having a low viscosity and excellent handling workability even if it is highly filled.

The average particle diameter of such a thermally conductive filler or electrically conductive filler is preferably in the range of 0.1 to 100 μm in terms of the median diameter, particularly preferably in the range of 0.1 to 50 μm.

The liquid curable silicone adhesive composition may also optionally contain: an organic solvent such as toluene, xylene, acetone, methyl ethyl ketone, methyl isobutyl ketone, hexane, or heptane; or a non-crosslinkable diorganopolysiloxane such as α,ω-trimethylsiloxy group-blocked dimethylpolysiloxane, and α,ω-trimethylsiloxy group-blocked methylphenylpolysiloxane, as long as the object of the present invention is not impaired.

As long as the technical effects of the present invention are not impaired, the abovementioned liquid curable silicone adhesive composition may contain a hydrosilylation reaction catalyst or a photopolymerization initiator. These curing agents may be encapsulated, with a hydrosilylation reaction catalyst encapsulated having a high temperature melting wax wall agent, etc. capable of being used. Moreover, a hydrosilylation reaction catalyst such as a photoactive platinum complex curing catalyst that promotes a hydrosilylation reaction by high energy ray irradiation such as ultraviolet rays may be used. However, in terms of designing a one-part product which can be stored at room temperature, the product is preferably inactivated at least at room temperature by not containing a hydrosilylation reaction catalyst, or via encapsulation, etc.

Manufacturing Method of the Composition

The liquid curable silicone adhesive composition according to the present invention can be produced by uniformly mixing the curable reactive organopolysiloxane, two different curing catalysts, an adhesion promoter according to the present invention, a crosslinkable silane, and any other component while blocking moisture. Although the method for mixing each component of the organopolysiloxane composition may be a conventionally known method and is not particularly limited, a uniform mixture is generally made by simple stirring. Moreover, if a solid component such as an inorganic filler is contained as any component, mixing using a mixing apparatus is more preferable. While not particularly limited thereto, exemplary such mixing apparatuses may include a single or twin shaft continuous mixer, two rolls, a Ross mixer, a Hobart mixer, a dental mixer, a planetary mixer, a kneader mixer, a Henschel mixer, etc.

While the liquid curable silicone adhesive composition according to the present invention can be a multi-component (for example, two-part) composition, it is used as a one-part liquid curable silicone adhesive composition in terms of the formation of the below-mentioned primary cured product. The package or container is preferably stored in a form filled into a package or container (for example, a cartridge provided with a moisture proof layer such as aluminum foil) which can block moisture and water content in the atmosphere prior to use. Conventionally known methods for filling a container can be used without any particular limitations. In particular, the liquid curable silicone adhesive composition according to the present invention is advantageous in that in a moisture blocked package or container, any curing reaction is suppressed at room temperature, making it possible to provide a one-part liquid curable silicone adhesive composition capable of stably storing products for extended periods of time.

Application

The liquid curable silicone adhesive composition according to the present invention can form a primary cured product by curing in the presence of the abovementioned compositional characteristics and, if desired, in the presence of moisture at a temperature of 60° C. or lower, suitably within the range of room temperature (25° C.) to 50° C., and can form a high temperature cured product (adhesive layer) by heating the liquid composition or the abovementioned primary cured product at high temperatures which promote the peroxide curing reaction, specifically, at high temperatures of 90° C. or higher, suitably 100° C. or higher. Therefore, it is possible to suitably use the liquid curable silicone adhesive composition as an adhesive, sealant, or protective agent used in the manufacture of electronic components. In particular, the liquid curable silicone adhesive composition according to the present invention exhibits the abovementioned curing behavior, in addition to having no surface tack in the room temperature to low temperature range when moisture curing, and forms a relatively soft non-fluid body (primary cured product), while in contrast forming a high temperature cured product having relatively high hardness and high rubber elasticity from the liquid or primary cured product at high temperatures of 90° C. or higher, suitably 100° C. or higher. Therefore, the liquid curable silicone adhesive composition can easily respond to a process involving the use of the liquid curable silicone adhesive composition directly for the adhesion of an electronic component or a member for electronic equipment applications, etc., as well as the manufacture process involving distributing the primary cured product of the liquid curable silicone adhesive composition in advance on a part of a member for electronic equipment applications, in addition to disposing other members on the primary cured product at locations different from the location on which the primary cured product is disposed, then adhering it at high temperatures. At this time, the primary cured product is a relatively soft non-fluid body (primary cured product) having no surface tack, with curing not proceeding further at low temperatures. Therefore, it is advantageously easy to transport the primary cured product while disposed on a member for a substrate or electronic equipment applications and the primary cured product is advantageously stable and flat and has excellent stress relaxation performance, leading to problems of poor adhesion and curing at unintended locales. Moreover, because the adhesive strength is weak at the time of primary curing and provides high flexibility, it is also suitable for temporary stopping and positioning of the substrate and electronic equipment.

Primary Cured Product having High Temperature Curability

The liquid curable silicone adhesive composition according to the present invention forms a primary cured product by a curing reaction mainly involving a condensation reaction (particularly dehydration condensation, deoxime condensation, or dealcoholization condensation) with a hydrolysis reaction within the temperature range of 60° C. or lower, suitably 50° C. or lower, more suitably from room temperature (25° C.) to 50° C. The primary cured product has secondary curability at high temperatures due to radical reactive functional groups and organic peroxides remaining in the cured product at high temperatures of 90° C. or higher, suitably 100° C. or higher. However, the reaction does not substantially proceed at room temperature, consequently leading to the characteristic of maintaining the form of a relatively soft non-fluid body without surface tack. Note that while the conditions required for primary curing depend on the temperature and humidity, they are typically within the range of 12 hours to 48 hours if the 25° C.-RH (relative humidity) is approximately 50%. Note that in the presence of moisture, curing in deep portions may gradually continue, however, as long as the form of the non-fluid body is at least formed, such can be handled as a primary cured product.

While the primary cured product may be used alone, it is preferably used in a form in which the primary cured product is disposed on these substrates or members for electronic equipment by primary curing of the liquid curable silicone adhesive composition according to the present invention at room temperature, etc.

The substrate for forming the primary cured product is not particularly limited, with a desired substrate capable of being appropriately selected. Exemplary substrates include adherends or substrates made of glass, ceramics, mortar, concrete, wood, aluminum, copper, brass, zinc, silver, stainless steel, iron, zinc coated steel, tin plate, nickel plated surfaces, epoxy resins, phenol resins, and the like. Further, an adherend or a substrate made of a thermoplastic resin such as a polycarbonate resin, a polyester resin (particularly including polybutylene terephthalate), an ABS resin, a nylon resin, a polyvinyl chloride resin, a polyphenylene sulfide resin, or a polyphenylene ether resin is exemplified. Such may be in the form of rigid plates or flexible sheets.

In contrast, if the abovementioned primary cured product is used to manufacture an electronic component, exemplary substrates include electronic equipment including an electric circuit or electrode, etc. wherein a metal electrode (such as silver, copper, aluminum, or gold) and a metal oxide film electrode (such as ITO (Indium Tin Oxide)) are formed on base materials of glass, epoxy resin, polyimide resin, phenol resin, ceramics, etc.

In particular, the liquid curable silicone adhesive composition according to the present invention or the abovementioned primary cured product is advantageously able to firmly adhere the substrate and the member for electronic equipment to form a strong adhesive layer (cured layer) on various substrates at high temperatures of 90° C. or higher, suitably 100° C. or higher. Moreover, the abovementioned primary cured product has no surface tack and is flexible, the primary cured product can be removed and reworked, or the disposition on the substrate or member for electronic equipment can be appropriately changed as desired, potentially contributing to improved yield in terms of industrial production.

Since the abovementioned primary cured product has no surface tack, even when the surface (which may be the entire surface including the base material or the member for electronic equipment) is partially or completely covered with a sheet shaped member provided with a release layer in order to prevent contamination and dirt, the primary cured product can be easily peeled off during use.

The release layer-provided sheet shaped substrate is substantially flat and a substrate having an appropriate width and thickness depending on the application of a tape, film, or the like can be used without particular limitation, however, specifically, a composite sheet shaped substrate formed by laminating paper, a synthetic resin film, cloth, a synthetic fiber, a metal foil (aluminum foil, copper foil, or the like), glass fibers, or a plurality of these sheet shaped substrates is exemplified. The synthetic resin film is particularly preferable. While not particularly limited thereto, the thickness thereof is usually approximately 5 to 300 μm.

As the release agent used for forming the release layer, for example, an olefin resin, an isoprene resin, a rubber elastomer such as a butadiene resin, a long chain alkyl resin, an alkyd resin, a fluorine resin, a silicone resin, or the like is used.

A member in which the primary cured product is disposed on a base material or a member for electronic equipment as well as a member in which the primary cured product is partially or completely covered with a sheet shaped member provided with a release layer can be suitably used as an electronic component, electronic equipment, or a precursor thereof, and is particularly suited to long-distance transportation.

High Temperature Curing

If the liquid curable silicone adhesive composition or the abovementioned primary cured product is cured by heating, it preferably includes at least a step of curing the whole by a curing reaction by heating at temperatures of 90° C. or higher, suitably temperatures of 100° C. or higher, more preferably temperatures exceeding 120° C., and at temperatures of 150° C. or higher as required. In particular, the range of 90° C. to 200° C., 100° C. to 180° C., or 100° C. to 150° C. is suitably selected because of curing reactions with the organic peroxide and the radical reactive group. In the present invention, a high temperature curing reaction (peroxide curing reaction) is a main curing reaction, and compared with, for example, a hydrosilylation reaction, etc., such is less susceptible to poisoning against a platinum catalyst, etc. used in a hydrosilylation reaction, and is less susceptible to components causing curing inhibition, problems with poor curing of the composition can be suppressed, and a favorable and stable curing reaction can be achieved.

With the abovementioned high temperature curing, the liquid curable silicone adhesive composition or the abovementioned primary cured product has good adhesiveness to various types of substrates and forms an adhesive layer (cured layer) having excellent hard and rubber elasticity. As a result, the members disposed on the base material or the member for electronic equipment are firmly bonded and can be used as an electronic component or electronic equipment.

Combined Use of the Curing System

In the abovementioned primary curing to high temperature curing, it is described that the high temperature curing reaction (peroxide curing reaction) is mainly carried out by heating in the presence of moisture at a temperature of 60° C. or lower, suitably at room temperature to 50° C., 90° C. or higher, suitably 100° C. or higher. However, a photo curing reaction, a hydrosilylation reaction, etc. may be used in combination as desired as long as such does not impede the technical effects of the present invention.

Use as Adhesive

The liquid curable silicone adhesive composition according to the present invention is capable of storing a one-part product for extended periods of time at room temperature in a moisture blocked package or container. Herein the composition or the abovementioned primary cured product can form a cured product having semi-permanent adhesiveness to other members which are contacted or disposed, particularly during high temperature curing. At this time, the adhesive mode between the other member to be adhered and the adhesive layer obtained by this high temperature curing can be a adhered state in which the failure mode at the time of adhesion failure enters a cohesion mode and can be used as a semi-permanent adhesive. Therefore, the liquid curable silicone adhesive composition according to the present invention of the present invention or the abovementioned primary cured product is useful as an adhesive for use in manufacturing electronic components.

Use as a Protective Material, etc.

The liquid curable silicone adhesive composition according to the present invention can allow a one-part product to be stored for extended periods of time at room temperature in a package or container which blocks moisture, while the composition or the abovementioned primary cured product can be used as a protective agent for various members, particularly by forming a strong adhesive layer (cured product) due to high temperature curing. Moreover, the liquid curable silicone adhesive composition according to the present invention or the abovementioned primary cured product can also be used as a sealing material, a potting material, and a seal material, in addition to also being suitable for use as a sealant. Such applications include building members, electrical and electronic components, vehicle components, etc., however, the liquid curable silicone adhesive composition according to the present invention or the abovementioned primary cured product can also be used in the manufacture of structures made of metal and/or resin such as peripheral components of electrical and electronic equipment, onboard component cases, terminal boxes, lighting components, modules for solar cells, etc. The liquid curable silicone adhesive composition according to the present invention or the abovementioned primary cured product has excellent initial adhesiveness and adhesive durability, for example, even when applied to a circuit board and housing case thereof in the application of power semiconductors such as engine controls (in a transport machine), power/train systems, and air conditioner controls. Advantageously, when also incorporated into onboard electronic parts such as an electronic control unit (ECU) and used under harsh environments, excellent initial adhesiveness is achieved, while also improving the reliability and durability of these power semiconductors, onboard parts, etc.

Manufacturing Application of Electronic Components

The primary cured product of the liquid curable silicone adhesive composition according to the present invention is particularly useful in the manufacture of electronic components, and by forming this primary cured product on various substrates to form an arrangement surface of the electronic component which is stable, flat, and excellent in stress relaxation property, it is possible to realize the advantage in which processing failures of the electronic components due to the surface unevenness of the substrate, positional deviation of the electronic component, and vibration displacement (damping) at the time of manufacture of the electronic component is unlikely to occur during transportation. Moreover, because this primary cured product has no surface tack, the electronic component can be easily peeled off from the cured product, without generating many defective products derived from the residue (adhesive deposits).

Method for Manufacturing a Member for Electronic Equipment

The liquid curable silicone adhesive composition according to the present invention has excellent storage stability and handleability, with this composition or the abovementioned primary cured product capable of being suitably used in the manufacture of a member for electronic equipment, making it possible to firmly adhere the abovementioned substrate and members for electronic equipment.

Specific examples of such a manufacturing method include a method for adhering a member for electronic equipment having the following steps.

Step (I): disposing the liquid curable silicone adhesive composition according to the present invention or the abovementioned high temperature curable primary cured product in a substrate and a member for electronic equipment; and Step (II): heating the liquid curable silicone adhesive composition or the primary cured product disposed in Step (I) to 100° C. or higher.

Such a manufacturing method preferably includes the step of forming a high temperature curable primary cured product and specifically includes a method for adhering a member for electronic equipment having the following steps.

Step (I'): applying the liquid curable silicone adhesive composition according to the present invention on a substrate;

Step (II'): primarily curing the applied layer of Step (I') in the presence of moisture, 60° C. or lower, suitably within the temperature range of room temperature to 50° C.; and Step (III'): disposing the member for electronic equipment on the primary cured product of Step (II') and heating the member to 90° C. or higher, suitably 100° C. or higher.

Electronic Components, Electronic Equipment, or Precursors Thereof

Here, the abovementioned steps need not necessarily be carried out in the same location, region, or nation. For example, a base material containing a high temperature curable primary cured product obtained by the abovementioned Step (II') may be optionally covered in order to prevent contamination/breakage and transported to another manufacturing location (including imports from abroad or exports to foreign countries), after which Step (III') may be carried out at that location. That is, the substrate containing the high temperature curable primary cured product can be suitably used as an electronic component, electronic equipment, or a precursor thereof, making it useful. As described above, such a primary cured product is particularly preferably partially or completely covered with a sheet shaped member provided with a release layer.

Other Optional Processing

These electronic components which are adhered using the liquid curable silicone adhesive composition according to the present invention or the abovementioned high temperature curable primary cured product may be disposed or adhered at least partially in a state of having a configuration of an electronic circuit, an electrode pattern, an insulating film, etc., or after being disposed or adhered, potentially forming an electronic circuit, electrode pattern, insulating film, etc. When an electrode pattern or the like is formed, conventionally known means can be used without any particular limitations and the electrode pattern or the like may be formed by a vacuum evaporation method, a sputtering method, an electroplating method, a chemical plating method, an etching method, a printing method, or a lift off method. Further, the electronic component adhered using the liquid curable silicone adhesive composition according to the present invention or the abovementioned high temperature curable primary cured product may be formed by forming the electronic circuit, the electrode pattern, the insulating film, etc., and optionally singulating (dicing) the laminate.

EXAMPLES

Hereinafter, the present invention will be described by way of examples, however, the present invention is not limited thereto. In the examples shown below, the following compounds or compositions were used as raw materials.

Component (A)

A-1: a dimethylpolysiloxane blocked by a dimethylvinylsiloxy group at both terminals of a molecular chain (viscosity: 40,000 mPa/s, Vi content: 0.08 mass %)

A-2: a dimethylpolysiloxane blocked by a dimethylvinylsiloxy group at both terminals of a molecular chain (viscosity: 10,000 mPa/s, Vi content: 0.12 mass %)

A-3: a dimethylpolysiloxane blocked by a dimethylvinylsiloxy group at both terminals of a molecular chain (viscosity: 2,000 mPa/s, Vi content: 0.23 mass %)

A-4: a siloxane resin represented by $(CH_2{=}CH(CH_3)_2SiO_{0.5})_4((CH_3)_3SiO_{0.5})_{40}(SiO_{2.0})_{56}$ (Vi content: 0.68 mass %, weight average molecular weight: 20,000)

Component (B)

[Formula 18]

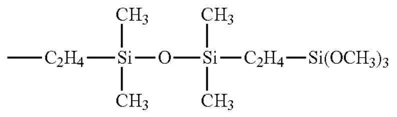

B-1: a dimethylpolysiloxane having an alkoxysilyl-containing group at both terminals of a molecular chain represented by the abovementioned structural formula (viscosity: 40,000 mPa·s)

B-2: a dimethylpolysiloxane having an alkoxysilyl-containing group at both terminals of a molecular chain represented by the abovementioned structural formula (viscosity: 10,000 mPa·s)

B-3: a dimethylpolysiloxane having an alkoxysilyl-containing group at both terminals of a molecular chain represented by the abovementioned structural formula (viscosity: 2,000 mPa·s)

B-4: a dimethylpolysiloxane having a trimethoxysilyl group at both terminals of a molecular chain (viscosity: 2,000 mPa·s)

B-5: a dimethylpolysiloxane having a hydroxyl group at both terminals of a molecular chain (viscosity: 4,000 mPa·s)

B-6: a dimethylpolysiloxane having a hydroxyl group at both terminals of a molecular chain (viscosity: 17,000 mPa·s)

Y: 50 mol % of the vinyl group of a dimethylsiloxane-methylvinylsiloxane copolymer blocked by a dimethylvinylsiloxy group at both terminals of a molecular chain (viscosity: 8,000 mPa·s, Vi content: 0.29 mass %) substituted with an alkoxy group-containing functional group of the above formula Component (C)

C-1: di(isopropoxy)bis(ethylacetoacetate)titanium

C-2: a dimethyltin di-neodecyl ester

Component (D):

D-1: a di(4-methylbenzoyl)peroxide (Organic peroxide: Nyper PMB 10 manufactured by NOF Corporation, having a ten hour half-life temperature of 70.6° C.)

D-2: a t-butylperoxy 2-ethylhexyl carbonate (Organic peroxide: Trigonox 117 manufactured by Kayaku Akzo Co., Ltd., having a ten hour half-life temperature of 98° C.)

Component (E):

E-1: a cyclocondensation reaction product of an alkoxysilane having an amino group-containing organic group and an alkoxysilane having an epoxy group-containing organic group) represented by the following formula

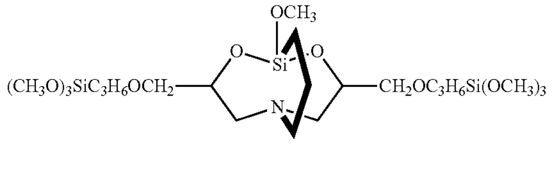

E-2: a condensation reaction product of 3-glycidoxypropyl trimethoxysilane and a methylvinyl siloxane oligomer in a mass ratio of 1:1 blocked by a hydroxyl group on both terminals of a molecular chain with a viscosity of 30 mPa·s E-3: a triallyl isocyanurate E-4: a methacroxypropyltrimethoxysilane E-5: an ethylenediamine propyltrimethoxysilane Component (F):

F-1: a methyltrimethoxysilane

F-2: a vinyltris(methylethylketoxime)silane

Component (G): surface hydrophobized fumed silica with a specific surface area of 150 $m^2/g$ Adjustment method of the composition, as well as the evaluation method thereof.

The composition indicated in the table below was produced. Specifically, the abovementioned components (A), (B), and (G) were mixed in advance, after which, once components (D), (E), and (F) were added and sufficiently stirred, component (C) was added under hermetically sealed conditions which blocked moisture, stirred under reduced pressure, and directly placed in a sealed container which blocked moisture. The composition thereof can be stably stored in this closed container at room temperature.

The viscosity of the step curable one-part silicone adhesive composition, storage modulus after primary curing, surface tack, storage modulus after secondary curing, adhesive strength (MPa) after secondary curing, and failure mode were evaluated according to the following methods, with the results indicated in each table.

Initial Viscosity

The initial viscosity (Pa·s) at 25° C. prior to curing of the composition was measured at a shear rate of 1.0 (1/s) using a rheometer (MCR102) manufactured by Anton Paar GmbH.

Surface Tack of the Primary Cured Product

The composition was applied to a Teflon (registered trademark) sheet to give a thickness of approximately 3 mm and cured for 24 hours under an environment of 25° C./50% RH to obtain a test piece for a primary cured product. The presence of surface tack of the obtained test sample was evaluated by surface finger touch evaluation according to the method stipulated in JIS K 6249 "Testing methods for uncured and cured silicone rubber."

Storage Modulus of the Cured Product (25° C./100° C.)

A sheet-like primary cured product test piece having a thickness of approximately 3 mm was produced by curing at room temperature in the presence of moisture in the same manner as the abovementioned surface tack, and the storage modulus ($G'_1$) at 25° C. was measured using a rheometer (MCR102) manufactured by Anton Paar GmbH. Note that the frequency was 1 Hz.

Similarly, a test piece of the primary cured product was heated at 100° C. for 60 minutes to produce a cured test sample of the secondary cured product, after which the storage modulus ($G'_2$) at 25° C. was measured using a rheometer (MCR102) manufactured by Anton Paar GmbH. Note that the frequency was 1 Hz. Here, it was confirmed that the same storage modulus ($G'_2$) was obtained even when each composition was cured by heating at 100° C. for 60 minutes without primary curing.

Moreover, regarding the increase rate (%) in the storage modulus ($G'_2$) of the cured product cured by heating at 100° C. and curing at a storage modulus ($G'_1$) of the cured product measured by the abovementioned method at room temperature (25° C.) ($G'_1$):

$$\Delta\text{: Increase rate of the storage modulus}=(G'_2-G'_1)/G'_1\times100(\%)$$

The results are indicated in each table.

Adhesion

As an adherend, an alumite plate and a polybutylene terephthalate (PBT) resin plate were each prepared, after which the curable organopolysiloxane composition was applied to give a thickness of 1 mm and cured for 24 hours under an environment of 25° C./50% RH. Further, the alumite plate and the PBT resin plate were placed over the primary cured product of each composition holding the primary cured product therebetween, which was then cured by heating at a temperature of 100° C. for 60 minutes.

The tensile shear adhesive strength of the obtained adhesion test pieces was measured in accordance with the method specified in JIS K 6850:1999 "Adhesives-Determination of tensile lap-shear strength of rigid-to-rigid bonded assemblies," and recorded. The tensile speed was 50 mm/min. Note that all the units of adhesive strength in Table 1 are MPa.

In addition, the failure state of the adhesive after fracture was observed, with o marked in the case of cohesive failure and x marked in the case of interfacial failure.

TABLE 1

| | Example 1 | Example 2 | Example 3 | Example 4 | Example 5 |
|---|---|---|---|---|---|
| A-2 | 70 | 70 | 70 | 70 | 30 |
| B-2 | 30 | | | | 70 |
| B-4 | | 30 | | | |
| B-5 | | | 30 | 30 | |
| C-1 | 1 | 1 | 1 | | 1 |
| C-2 | | | | 0.015 | |
| D-1 | 1 | 1 | 1 | 1 | 1 |
| E-1 | 0.2 | 0.2 | 0.2 | | 0.2 |
| E-2 | 0.5 | 0.5 | 0.5 | | 0.5 |
| E-3 | 0.5 | 0.5 | 0.5 | | 0.5 |
| E-5 | | | | 0.25 | |
| G | 5 | 5 | 5 | 10 | 5 |
| F-1 | 1 | 1 | 1 | | 1 |
| F-2 | | | | 4 | |
| Initial viscosity (Pa · s) | 24 | 18 | 19 | 78 | 24 |
| Surface tack of the primary cured product | None | None | None | None | None |
| Storage modulus ($G'_1$(Pa)) after primary curing | $4.5\times10^3$ | $1.75\times10^4$ | $1.65\times10^4$ | $5.15\times10^3$ | $9.55\times10^4$ |

TABLE 1-continued

| | Example 1 | Example 2 | Example 3 | Example 4 | Example 5 |
|---|---|---|---|---|---|
| Storage modulus ($G'_2$(Pa)) after secondary curing | $2.95\times10^5$ | $3.45\times10^5$ | $4.95\times10^5$ | $2.85\times10^5$ | $6.55\times10^5$ |
| Increase rate of the storage modulus | 6270 | 1900 | 2960 | 5390 | 580 |
| Adhesion after secondary curing | | | | | |
| PBT | ○ | ○ | ○ | ○ | ○ |
| Alumite | ○ | ○ | ○ | ○ | ○ |
| Adhesive strength (MPa) after secondary curing | | | | | |
| PBT | 0.4 | 0.4 | 0.4 | 0.4 | 0.4 |
| Alumite | 0.4 | 0.4 | 0.4 | 0.4 | 0.5 |

TABLE 2

| | Example 6 | Example 7 | Example 8 | Example 9 | Example 10 |
|---|---|---|---|---|---|
| A-1 | 5 | | | 12 | |
| A-2 | | 70 | 70 | | |
| A-3 | 5 | | | 15 | |
| A-4 | | | | 8 | |
| B-1 | 45 | | | | |
| B-2 | | 30 | 30 | 65 | |
| B-3 | 45 | | | | |
| Y | | | | | 100 |
| C-1 | 1 | 1 | 1 | 1 | 1 |
| D-1 | 1 | | 1 | 2 | 2 |
| D-2 | | 1 | | | |
| E-1 | 0.2 | 0.2 | 0.2 | 0.3 | 0.3 |
| E-2 | 0.5 | 0.5 | | 0.6 | 0.6 |
| E-3 | 0.5 | 0.5 | | 0.6 | 0.6 |
| E-4 | | | 0.5 | | |
| G | 18 | 5 | 5 | 18 | 18 |
| F-1 | 1 | 1 | 1 | 1 | 1 |
| Initial viscosity (Pa · s) | 219 | 23 | 22 | 323 | 242 |
| Surface tack of the primary cured product | None | None | None | None | None |
| Storage modulus ($G'_1$(Pa)) after primary curing | $3.8\times10^5$ | $4.3\times10^3$ | $5.8\times10^3$ | $1.0\times10^5$ | $1.9\times10^5$ |
| Storage modulus ($G'_2$(Pa)) after secondary curing | $1.0\times10^6$ | $2.7\times10^5$ | $5.0\times10^5$ | $7.9\times10^5$ | $6.1\times10^5$ |
| Increase rate of the storage modulus | 160 | 6180 | 8520 | 670 | 230 |
| Adhesion after secondary curing | | | | | |
| PBT | ○ | ○ | ○ | ○ | ○ |
| Alumite | ○ | ○ | ○ | ○ | ○ |
| Adhesive strength (MPa) after secondary curing | | | | | |
| PBT | 0.7 | 0.4 | 0.5 | 1.8 | 0.7 |
| Alumite | 0.9 | 0.4 | 0.5 | 2.0 | 0.8 |

TABLE 3

| | Comparative Example 1 | Comparative Example 2 | Comparative Example 3 | Comparative Example 4 |
|---|---|---|---|---|
| A-2 | 100 | 70 | 70 | 70 |
| B-2 | | 30 | 30 | 30 |
| C-1 | 1 | | 1 | 1 |

TABLE 3-continued

| | Comparative Example 1 | Comparative Example 2 | Comparative Example 3 | Comparative Example 4 |
|---|---|---|---|---|
| D-1 | 1 | 1 | | 1 |
| E-1 | 0.2 | 0.2 | 0.2 | |
| E-2 | 0.5 | 0.5 | 0.5 | |
| E-3 | 0.5 | 0.5 | 0.5 | |
| G | 5 | 5 | 5 | 5 |
| F-1 | 1 | 1 | 1 | 1 |
| Initial viscosity (Pa · s) | 23 | 23 | 24 | 27 |
| Surface tack of the primary cured product | Cracks generated | Cracks generated | None | None |
| Storage modulus ($G'_1$(Pa)) after the primary cured product | 4.9 × 10 | 4.7 × 10 | 4.5 × $10^3$ | 4.6 × $10^3$ |
| Storage modulus ($G'_2$(Pa)) after the secondary cured product | 8.0 × $10^5$ | 2.5 × $10^5$ | 4.6 × $10^3$ | 2.0 × $10^5$ |
| Increase rate of the storage modulus | 1630000 | 532000 | 2 | 4250 |
| Breakage state of the adhesive interface after secondary curing | | | | |
| PBT | ○ | ○ | x | x |
| Alumite | ○ | ○ | x | x |
| Adhesive strength (MPa) after secondary curing | | | | |
| PBT | 0.7 | 0.4 | 0.2 | 0.1 |
| Alumite | 0.7 | 0.4 | 0.2 | 0.1 |

As indicated in Examples 1 to 10, the primary cured product obtained by curing the composition according to the present invention at room temperature (25° C.) in the presence of moisture has little surface tack and is capable of secondary curing at 100° C. Further, when the primary cured product cured at room temperature (25° C.) and the secondary cured product cured at 100° C. were compared, the storage elastic modulus of these compositions was 50% or higher, while the secondary curing reaction of the cured product involving a drastic change in physical properties progressed at high temperatures, with the composition capable of being adjusted to design a change in the storage modulus of the primary/secondary cured product over a wide range from Example 6 (160%) to Example 8 (8520%). In addition, it was found that each of the compositions according to the present invention was capable of forming a strong adhesion with an adherend after a secondary curing reaction at high temperatures.

On the other hand, in Comparative Examples 1 and 2, which lacked component (B) or (C) according to the present invention, there was a surface tack of the primary cured product, which was not suitable for use as the object of the present invention. Moreover, in Comparative Example 3, which lacked component (D), secondary curability was not achieved, while sufficient adhesive strength was not achieved with the adherend. Similarly, Comparative Example 4, which lacked component (E), was unable to achieve sufficient adhesive strength with the adherend.

The invention claimed is:

1. A one-part liquid curable silicone adhesive composition which does not contain a hydrosilylation reaction catalyst, the composition comprising:

100 parts by mass of a curable reactive organopolysiloxane component which is a mixture of two or more components selected from the group consisting of component (A), component (B), and component (Y), and has a radical polymerizable group along with a condensation polymerizable group in the mixture:

Component (A)—an organopolysiloxane having at least one radical polymerizable group per molecule;

Component (B)—an organopolysiloxane having at least one condensation polymerizable group per molecule, the condensation polymerizable group being-represented by Formula 1:

(Formula 1)

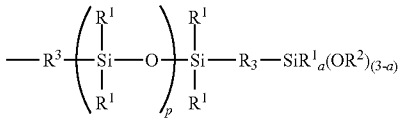

wherein $R^1$ is the same or different monovalent hydrocarbon group not having an aliphatic unsaturated bond, $R^2$ is an alkyl group, $R^3$ is the same or different alkylene group, a is an integer of 0 to 2, and p is an integer of 1 to 50; and Component (Y)—an organopolysiloxane having at least one radical polymerizable group and at least one condensation polymerizable group per molecule;

(C) 0.1 to 10 parts by mass of a condensation reaction catalyst;

(D) 0.1 to 10 parts by mass of an organic peroxide;

(E) 0.1 to 10 parts by mass of an adhesion imparting agent; and (F) 0.5 to 10 parts by mass of a crosslinkable silane having at least two condensation polymerizable groups per molecule except for those corresponding to component (E);

wherein an increase rate ΔG as represented by Formula 2 is at least 50%, $$\Delta G=((G'_2-G'_1)/G'_1)\times 100\% \quad \text{(Formula 2)}$$

$G'_1$ is the storage modulus measured at 25° C. of a cured product obtained by curing the one-part liquid curable silicone adhesive composition in the presence of moisture within a temperature range of room temperature to 50° C., and $G'_2$ is the storage modulus measured at 25° C. of a cured product cured by heating and curing the one-part liquid curable silicone adhesive composition within a temperature range of 100° C. to 200° C.

2. The one-part liquid curable silicone adhesive composition according to claim 1, wherein the molecular structure of the curable reactive organopolysiloxane component is selected from linear, branched, or combinations thereof.

3. The one-part liquid curable silicone adhesive composition according to claim 1, wherein the radical polymerizable group in the curable reactive organopolysiloxane component is an alkenyl group, an acryl-containing organic group, or a methacryl-containing organic group, and wherein at least one of the at least one condensation polymerizable group is an alkoxysilyl-containing group or a silanol group.

4. The one-part liquid curable silicone adhesive composition according to claim 1, wherein the curable reactive organopolysiloxane component is a mixture of two or more components selected from the group consisting of component (A1), component (B1), and component (Y1):

Component (A1) a methylpolysiloxane having at least one alkenyl group per molecule;

Component (B1) a methylpolysiloxane having at least condensation polymerizable group represented by Formula 1 per molecule; and Component (Y1) a methylpolysiloxane having at least one alkenyl group and at least one alkoxysilyl-containing group per molecule.

5. The one-part liquid curable silicone adhesive composition according to claim 1, wherein the curable reactive organopolysiloxane component contains a mixture of component (A1-1) and component (B1-1) at a 5:95 to 95:5 weight ratio:

Component (A1-1) a linear dimethylpolysiloxane terminated by a dimethylalkenylsiloxy group at both terminals of a molecular chain; and Component (B1-1) a linear dimethylpolysiloxane having condensation polymerizable groups represented by Formula 1 bonded to silicon atoms at both terminals of a molecular chain

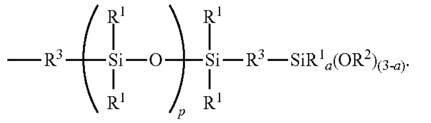

6. The one-part liquid curable silicone adhesive composition according to claim 1, wherein the adhesion imparting agent (E) contains at least one adhesion imparting agent selected from the group consisting of: an epoxy group-containing alkoxysilane or a partially hydrolyzed condensate thereof; a condensation reaction product of an epoxy group-containing alkoxysilane and a condensation polymerizable organopolysiloxane; an acrylic group-containing alkoxysilane; an amino group-containing alkoxysilane; isocyanurates; a reaction product of an epoxy group-containing alkoxysilane and an amino group-containing alkoxysilane; and an organic compound having at least two alkoxysilyl groups per molecule and a bond other than a silicon-oxygen bond between the alkoxysilyl groups.

7. The one-part liquid curable silicone adhesive composition according to claim 1, wherein the crosslinkable silane (F) is a crosslinkable silane represented by Formula 3:

$$R^4_bSiR^5_{(4-b)} \qquad \text{(Formula 3)}$$

wherein $R^4$ is the same or different alkyl group having a carbon number of 1 to 10, alkenyl group having a carbon number of 2 to 10, or aryl group having a carbon number of 6 to 20, $R^5$ is the same or different hydroxyl group, alkoxy group having a carbon number of 1 to 5, $—ON{=}C(CH_3)C_2H_5$, $—OCOCH_3$, or $—OC({=}CH_2)CH_3$, and b is 0, 1, or 2.

8. The one-part liquid curable silicone adhesive composition according to claim 1, further comprising (G) a reinforcing filler.

9. The one-part liquid curable silicone adhesive composition according to claim 1, wherein a viscosity of the one-part liquid curable silicone adhesive composition at room temperature before curing reaction is within the range of 10 to 500 Pa·s.

10. A high temperature curable primary cured product, the high temperature curable primary cured product being formed by primarily curing the one-part liquid curable silicone adhesive composition according to claim 1 within a temperature range of room temperature to 60° C. in the presence of moisture.

11. A cured product formed by heating to 90° C. or higher the one-part liquid curable silicone adhesive composition according to claim 1.

12. A method for adhering a member for electronic equipment, the method comprising applying the one-part liquid curable silicone adhesive composition according to claim 1 to a substrate and/or the member.

13. A method for adhering a member for electronic equipment, the method comprising the following Steps:

(I) disposing a one-part liquid curable silicone adhesive composition or a high temperature curable primary cured product formed by primarily curing the one-part liquid curable silicone adhesive composition within a temperature range of room temperature to 60° C. between a substrate and a member for electronic equipment; and (II) heating the one-part liquid curable silicone adhesive composition or the high temperature curable primary cured product disposed in Step (I) to 90° C. or higher; wherein the one-part liquid curable silicone adhesive composition is according to claim 1.

14. A method for adhering a member for electronic equipment comprising curing a one-part liquid curable silicone adhesive composition, the method comprising the following Steps:

(I') applying the one-part liquid curable silicone adhesive composition on a substrate to form an applied layer;

(II') primarily curing the applied layer of Step (I') in the presence of moisture within a temperature range of room temperature to 60° C. to form a primary cured product; and (III') disposing the member for electronic equipment on the primary cured product of Step (II') and heating the member for electronic equipment to 90° C. or higher; wherein the one-part liquid curable silicone adhesive composition is according to claim 1.

15. An electronic component, electronic equipment, or a precursor thereof, comprising a high temperature curable primary cured product formed by primarily curing the one-part liquid curable silicone adhesive composition according to claim 1 within a temperature range of room temperature to 60° C. in the presence of moisture.

16. The electronic component, electronic equipment, or precursor thereof according to claim 15, wherein the high temperature curable primary cured product is partially or completely covered with a sheet shaped member provided with a release layer.

17. A cured product formed by heating to 90° C. or higher the high temperature curable primary cured product according to claim 10.

* * * * *